United States Patent
Bruce et al.

(10) Patent No.: US 10,789,549 B1
(45) Date of Patent: Sep. 29, 2020

(54) ENFORCING, WITH RESPECT TO CHANGES IN ONE OR MORE DISTINGUISHED INDEPENDENT VARIABLE VALUES, MONOTONICITY IN THE PREDICTIONS PRODUCED BY A STATISTICAL MODEL

(71) Applicant: Zillow, Inc., Seattle, WA (US)

(72) Inventors: Andrew Bruce, Seattle, WA (US); Chunyi Wang, Seattle, WA (US); Yeng Bun, Seattle, WA (US); Andrew Martin, Seattle, WA (US)

(73) Assignee: Zillow, Inc., Seattle, WA (US)

( * ) Notice: Subject to any disclaimer, the term of this patent is extended or adjusted under 35 U.S.C. 154(b) by 638 days.

(21) Appl. No.: 15/439,388

(22) Filed: Feb. 22, 2017

Related U.S. Application Data

(60) Provisional application No. 62/300,054, filed on Feb. 25, 2016.

(51) Int. Cl.
G06N 20/00 (2019.01)
G06F 17/18 (2006.01)
(Continued)

(52) U.S. Cl.
CPC ............ *G06N 20/00* (2019.01); *G06F 17/18* (2013.01); *G06F 30/20* (2020.01); *G06N 5/04* (2013.01)

(58) Field of Classification Search
CPC .......... G06N 20/00; G06N 5/04; G06F 17/18; G06F 17/5009
See application file for complete search history.

(56) References Cited

U.S. PATENT DOCUMENTS 4,870,576 A 9/1989 Tornetta
5,361,201 A 11/1994 Jost et al.
(Continued)

FOREIGN PATENT DOCUMENTS

EP 1903491 A1 3/2008
WO WO-9524687 9/1995
(Continued)

OTHER PUBLICATIONS

Manski, Charles F., and John V. Pepper. "Monotone Instrumental Variables: With an Application to the Returns to Schooling." Econometrica 68 (Jul. 2000): 997-1010. (Year: 2000).*
(Continued)

*Primary Examiner* — Kamran Afshar
*Assistant Examiner* — Randall K. Baldwin
(74) *Attorney, Agent, or Firm* — Perkins Coie LLP

(57) ABSTRACT

A facility for estimating a value relating to an occurrence is described. The facility receives a first occurrence specifying a first value for each of a plurality of independent variables that include a distinguished independent variable designated to be monotonically linked to a dependent variable. The facility subjects the first independent variable values specified by the received occurrence to a statistical model to obtain a first value of the dependent variable. The facility receives a second occurrence specifying a second value for each of the plurality of independent variables (the second values varying from the first values in a first direction). The facility subjects the second independent variable values to the statistical model to obtain a second value of the dependent variable, the second value of the dependent variable being guaranteed not to vary from the first value of the dependent variable in a second direction opposite the first direction.

20 Claims, 5 Drawing Sheets

(51) Int. Cl.
  *G06N 5/04* (2006.01)
  *G06F 30/20* (2020.01)

(56) References Cited

U.S. PATENT DOCUMENTS

| | | |
|---|---|---|
| 5,414,621 A | 5/1995 | Hough |
| 5,584,025 A | 12/1996 | Keithley et al. |
| 5,680,305 A | 10/1997 | Apgar, IV |
| 5,754,850 A | 5/1998 | Janssen |
| 5,794,216 A | 8/1998 | Brown |
| 5,855,011 A | 12/1998 | Tatsuoka |
| 5,857,174 A | 1/1999 | Dugan |
| 6,115,694 A | 9/2000 | Cheetham et al. |
| 6,178,406 B1 | 1/2001 | Cheetham et al. |
| 6,240,425 B1 | 5/2001 | Naughton |
| 6,260,033 B1 | 7/2001 | Tatsuoka |
| 6,301,571 B1 | 10/2001 | Tatsuoka |
| 6,397,208 B1 | 5/2002 | Lee |
| 6,401,070 B1 | 6/2002 | McManus et al. |
| 6,446,261 B1 | 9/2002 | Rosser |
| 6,493,721 B1 | 12/2002 | Getchius et al. |
| 6,597,983 B2 | 7/2003 | Hancock |
| 6,609,118 B1 | 8/2003 | Khedkar et al. |
| 6,615,187 B1 | 9/2003 | Ashenmil |
| 6,684,196 B1 | 1/2004 | Mini et al. |
| 6,760,707 B2 | 7/2004 | Provost |
| 6,876,955 B1 | 4/2005 | Fleming et al. |
| 6,877,015 B1 | 4/2005 | Kilgore et al. |
| 6,915,206 B2 | 7/2005 | Sasajima |
| 7,016,866 B1 | 3/2006 | Chin et al. |
| 7,092,918 B1 | 8/2006 | Delurgio et al. |
| 7,120,599 B2 | 10/2006 | Keyes |
| 7,130,810 B2 | 10/2006 | Foster et al. |
| 7,219,078 B2 | 5/2007 | Lamont et al. |
| 7,249,146 B2 | 7/2007 | Brecher |
| 7,289,965 B1 | 10/2007 | Bradley et al. |
| 7,454,355 B2 | 11/2008 | Milman et al. |
| 7,461,265 B2 | 12/2008 | Ellmore |
| 7,487,114 B2 | 2/2009 | Florance et al. |
| 7,567,262 B1 | 7/2009 | Clemens et al. |
| 7,827,128 B1 | 1/2010 | Yan et al. |
| 7,711,574 B1 | 5/2010 | Bradley et al. |
| 7,725,359 B1 | 5/2010 | Katzfey et al. |
| 7,783,562 B1 | 8/2010 | Ellis |
| 7,788,186 B1 | 8/2010 | An et al. |
| 7,848,966 B2 | 12/2010 | Charuk et al. |
| 7,933,798 B1 | 4/2011 | Yan et al. |
| 7,970,674 B2 | 6/2011 | Cheng et al. |
| 8,001,024 B2 | 8/2011 | Graboske et al. |
| 8,015,091 B1 | 9/2011 | Ellis |
| 8,032,401 B2 | 10/2011 | Choubey |
| 8,051,089 B2 | 11/2011 | Gargi et al. |
| 8,095,434 B1 | 1/2012 | Puttick et al. |
| 8,140,421 B1 * | 3/2012 | Humphries ............ G06Q 20/10 705/36 R |
| 8,180,697 B2 | 5/2012 | Frischer |
| 8,190,516 B2 | 5/2012 | Ghosh et al. |
| 8,370,267 B2 | 2/2013 | Carey et al. |
| 8,401,877 B2 | 3/2013 | Salvagio |
| 8,473,347 B1 | 6/2013 | Koningstein |
| 8,515,839 B2 | 8/2013 | Ma et al. |
| 8,521,619 B2 | 8/2013 | Perry, III et al. |
| 8,583,562 B1 | 11/2013 | McDaniel et al. |
| 8,628,151 B1 | 1/2014 | Allen et al. |
| 8,650,067 B1 | 2/2014 | Moss |
| 8,660,919 B2 | 2/2014 | Kasower |
| 8,676,680 B2 | 3/2014 | Humphries et al. |
| 8,775,300 B2 | 7/2014 | Showalter |
| 9,536,011 B1 | 1/2017 | Kirillov |
| 9,605,704 B1 | 3/2017 | Humphries et al. |
| 2001/0039506 A1 | 11/2001 | Robbins |
| 2001/0044766 A1 | 11/2001 | Keyes |
| 2002/0007336 A1 | 1/2002 | Robbins |
| 2002/0035520 A1 | 3/2002 | Weiss |
| 2002/0052814 A1 | 5/2002 | Ketterer |
| 2002/0082903 A1 | 6/2002 | Yasuzawa |
| 2002/0087389 A1 | 7/2002 | Sklarz et al. |
| 2002/0188689 A1 | 12/2002 | Michael |
| 2003/0004781 A1 | 1/2003 | Mallon et al. |
| 2003/0046099 A1 | 3/2003 | Lamont et al. |
| 2003/0055747 A1 | 3/2003 | Carr et al. |
| 2003/0078878 A1 | 4/2003 | Opsahl-Ong |
| 2003/0078897 A1 | 4/2003 | Florance et al. |
| 2003/0101063 A1 | 5/2003 | Sexton et al. |
| 2003/0101074 A1 | 5/2003 | Suzuki et al. |
| 2003/0110122 A1 | 6/2003 | Nalebuff et al. |
| 2003/0149658 A1 | 8/2003 | Rossbach et al. |
| 2003/0191723 A1 | 10/2003 | Foretich et al. |
| 2003/0212565 A1 | 11/2003 | Badali et al. |
| 2004/0019517 A1 | 1/2004 | Sennott |
| 2004/0030616 A1 | 2/2004 | Florance et al. |
| 2004/0039629 A1 | 2/2004 | Hoffman et al. |
| 2004/0049440 A1 | 3/2004 | Shinoda et al. |
| 2004/0054605 A1 | 3/2004 | Whittet |
| 2004/0073508 A1 | 4/2004 | Foster et al. |
| 2004/0093270 A1 | 5/2004 | Gilbert |
| 2004/0128215 A1 | 7/2004 | Florance et al. |
| 2004/0153330 A1 | 8/2004 | Miller et al. |
| 2004/0220872 A1 | 11/2004 | Pollock |
| 2004/0243470 A1 | 12/2004 | Ozer et al. |
| 2004/0254803 A1 | 12/2004 | Myr |
| 2004/0267657 A1 | 12/2004 | Hecht |
| 2005/0071376 A1 | 3/2005 | Modi |
| 2005/0080702 A1 | 4/2005 | Modi |
| 2005/0108084 A1 | 5/2005 | Ramamoorti et al. |
| 2005/0154656 A1 | 7/2005 | Kim et al. |
| 2005/0154657 A1 | 7/2005 | Kim et al. |
| 2005/0187778 A1 | 8/2005 | Mitchell |
| 2005/0192930 A1 | 9/2005 | Hightower et al. |
| 2005/0240429 A1 | 10/2005 | Dieden et al. |
| 2005/0254803 A1 | 11/2005 | Ono |
| 2005/0288942 A1 | 12/2005 | Graboske et al. |
| 2005/0288957 A1 | 12/2005 | Eraker et al. |
| 2006/0015357 A1 | 1/2006 | Cagan |
| 2006/0020424 A1 | 1/2006 | Quindel |
| 2006/0080114 A1 | 4/2006 | Bakes et al. |
| 2006/0085210 A1 | 4/2006 | Owens |
| 2006/0089842 A1 | 4/2006 | Medawar |
| 2006/0105342 A1 | 5/2006 | Villena et al. |
| 2006/0122918 A1 | 6/2006 | Graboske et al. |
| 2006/0167710 A1 | 7/2006 | King et al. |
| 2006/0248555 A1 | 11/2006 | Eldering |
| 2007/0005373 A1 | 1/2007 | Villena et al. |
| 2007/0043770 A1 | 2/2007 | Goodrich et al. |
| 2007/0050342 A1 | 3/2007 | Inkinen et al. |
| 2007/0067180 A1 | 3/2007 | James et al. |
| 2007/0106523 A1 | 5/2007 | Eaton et al. |
| 2007/0124235 A1 | 5/2007 | Chakraborty et al. |
| 2007/0132727 A1 | 6/2007 | Garbow et al. |
| 2007/0143132 A1 | 6/2007 | Linne et al. |
| 2007/0143312 A1 | 6/2007 | Wiseman |
| 2007/0150353 A1 | 6/2007 | Krassner |
| 2007/0244780 A1 | 10/2007 | Liu |
| 2007/0255581 A1 | 11/2007 | Otto et al. |
| 2007/0265960 A1 | 11/2007 | Advani |
| 2008/0004893 A1 | 1/2008 | Graboske et al. |
| 2008/0015890 A1 | 1/2008 | Malyala |
| 2008/0077458 A1 | 3/2008 | Andersen et al. |
| 2008/0086356 A1 | 4/2008 | Glassman et al. |
| 2008/0109409 A1 | 5/2008 | Hengel |
| 2008/0133319 A1 | 6/2008 | Adiga et al. |
| 2008/0183598 A1 | 7/2008 | Carr et al. |
| 2008/0255921 A1 | 10/2008 | Flake et al. |
| 2008/0288335 A1 | 11/2008 | Goldberg |
| 2008/0301064 A1 | 12/2008 | Burns |
| 2008/0312942 A1 | 12/2008 | Katta et al. |
| 2009/0006185 A1 | 1/2009 | Stinson |
| 2009/0030707 A1 | 1/2009 | Green |
| 2009/0030864 A1 | 1/2009 | Pednault et al. |
| 2009/0037328 A1 | 2/2009 | Abuaf |
| 2009/0043603 A1 | 2/2009 | Rutherford et al. |
| 2009/0043637 A1 | 2/2009 | Eder |
| 2009/0048938 A1 | 2/2009 | Dupray |
| 2009/0076902 A1 | 3/2009 | Grinsted et al. |

(56) References Cited

U.S. PATENT DOCUMENTS

| | | |
|---|---|---|
| 2009/0132316 A1 | 5/2009 | Florance et al. |
| 2009/0144097 A1 | 6/2009 | Fassio et al. |
| 2009/0150216 A1 | 6/2009 | Milman et al. |
| 2009/0164464 A1 | 6/2009 | Carrico et al. |
| 2009/0210287 A1 | 8/2009 | Chickering et al. |
| 2009/0240586 A1 | 9/2009 | Ramer et al. |
| 2009/0265285 A1 | 10/2009 | Balaishis |
| 2009/0287596 A1 | 11/2009 | Torrenegra |
| 2010/0005019 A1 | 1/2010 | Yang et al. |
| 2010/0023379 A1 | 1/2010 | Rappaport |
| 2010/0076881 A1 | 3/2010 | O'Grady |
| 2010/0094548 A1 | 4/2010 | Tadman et al. |
| 2010/0114678 A1 | 5/2010 | Axe et al. |
| 2010/0161498 A1 | 6/2010 | Walker |
| 2010/0318451 A1 | 12/2010 | Niccolini |
| 2011/0047083 A1 | 2/2011 | Lawler |
| 2011/0066510 A1 | 3/2011 | Talegon |
| 2011/0066561 A1 | 3/2011 | Lazarre et al. |
| 2011/0071899 A1 | 3/2011 | Robertson et al. |
| 2011/0196762 A1 | 8/2011 | DuPont |
| 2011/0218934 A1 | 9/2011 | Elser |
| 2011/0218937 A1 | 9/2011 | Elser |
| 2011/0251967 A1 | 10/2011 | Klivington |
| 2011/0251974 A1 | 10/2011 | Woodward et al. |
| 2011/0270779 A1 | 11/2011 | Showalter |
| 2012/0005111 A2 | 1/2012 | Lowenstein et al. |
| 2012/0011075 A1 | 1/2012 | Graboske et al. |
| 2012/0030092 A1 | 2/2012 | Marshall et al. |
| 2012/0072357 A1 | 3/2012 | Bradford et al. |
| 2012/0078770 A1 | 3/2012 | Hecht |
| 2012/0158459 A1 | 6/2012 | Villena et al. |
| 2012/0191541 A1 | 7/2012 | Yang et al. |
| 2012/0254045 A1 | 10/2012 | Orfano |
| 2012/0311431 A1 | 12/2012 | Breaker et al. |
| 2012/0323798 A1 | 12/2012 | Den Herder et al. |
| 2013/0041841 A1 | 2/2013 | Lyons |
| 2013/0103459 A1 | 4/2013 | Marshall et al. |
| 2013/0159166 A1 | 6/2013 | Irick |
| 2013/0304654 A1 | 11/2013 | Ma et al. |
| 2013/0332877 A1 | 12/2013 | Florance et al. |
| 2013/0339255 A1 | 12/2013 | Talbird |
| 2014/0012720 A1 | 1/2014 | O'Kane |
| 2014/0180936 A1 | 6/2014 | Ma et al. |
| 2014/0236845 A1 | 8/2014 | Humphries et al. |
| 2014/0257924 A1 | 9/2014 | Xie |
| 2014/0279692 A1 | 9/2014 | Boothby et al. |
| 2014/0316857 A1 | 10/2014 | Roberts |
| 2014/0316999 A1 | 10/2014 | Cheng et al. |
| 2014/0372203 A1 | 12/2014 | Powell et al. |
| 2015/0006605 A1* | 1/2015 | Chu .................. G06F 17/18 708/446 |
| 2015/0066834 A1* | 3/2015 | Jeffries ............. H04N 19/463 706/52 |
| 2015/0149275 A1 | 5/2015 | Bax et al. |
| 2015/0269264 A1 | 9/2015 | Bolen |
| 2015/0356576 A1* | 12/2015 | Malaviya ......... G06Q 30/0202 705/7.31 |
| 2015/0379588 A1 | 12/2015 | Ma et al. |
| 2018/0232787 A1 | 8/2018 | Dupray |

FOREIGN PATENT DOCUMENTS

| | | |
|---|---|---|
| WO | WO-0055771 A1 | 9/2000 |
| WO | WO-0211038 A1 | 2/2002 |
| WO | WO-0242980 A1 | 5/2002 |
| WO | WO-03100692 A1 | 12/2003 |
| WO | WO-2005015441 A2 | 2/2005 |
| WO | WO-2006025830 A1 | 3/2006 |
| WO | WO-2006043951 A2 | 4/2006 |
| WO | WO-2007051892 A1 | 5/2007 |

OTHER PUBLICATIONS

Lu, J. F., and L. Lin HZ Wen. "An improved method of real estate evaluation based on Hedonic price model." IEEE International Engineering Management Conference. 2004. (Year: 2004).*

Zurowski, Brian. "Essays in Social and Behavioral Economics." Retrieved from the University of Minnesota Digital Conservancy, http://hdl.handle.net/11299/175495 (Year: 2015).*

Oladunni, Timothy, and Sharad Sharma. "Predictive Real Estate Multiple Listing System Using MVC Architecture and Linear Regression." ISCA 24th International Conference on Software Engineering and Data Engineering. 2015. (Year: 2015).*

Oladunni, Timothy, and Sharad Sharma. "Hedonic Housing Theory—A Machine Learning Investigation." (Year: 2016).*

"2002 Inman Innovator Award Nominees Announced," PR Newswire, Jul. 16, 2002, 3 pages.

"About Reis, Products & Services," [online], Retrieved from the Internet via the Wayback Machine dated Feb. 5, 2002 on Jun. 13, 2013, URL: http://reis.com/about/aboutproducts_rentcomps.cfm, 2 pages.

"An Introduction to R," <http://web.archive.org/web/20060118050840/http://crans-project.org/doc/manuals/R-intro.html>, [internet archive date: Jan. 18, 2006], pp. 1-105.

"Banton Technologies Announces National Home Evaluation Coverage; Company's ValueWizard 3.0 Assesses All Regions of the United States," Business Wire, Jun. 10, 2003, [online] Retrieved from the Internet: URL: http://www.the free library.com/_/print/PrintArticle.aspx?id=102949279, 2 pages.

"Basis100 Partners to Offer Automated Valuation Service," Canada StockWatch, Jan. 27, 2004, 2 pages.

"Basis100 Partners with First American," PR Newswire, Jan. 27, 2004, 3 pages.

"Casa(TM) to Value More Than $100 Billion of Residential Real Estate in 2001—Leading Lenders Saving Big without Compromising Loan Quality," PR Newswire, May 21, 2001, 3 pages.

"Centre for Mathematical Sciences," Lund University, http://web.archive.org/web/20060101005103/http://www.maths.lth.se/, [internet archive date: Jan. 1, 2006], 1 page.

"Directory of Valuation Providers, Your Source for Valuation Information," Zackin Publications Inc., 2004, 5 pages.

"First American Expands Real Estate Valuation Line, Aims to Increase Accuracy with Addition of Veros, Basis100 AVMs," Inman News, Mar. 15, 2004, 2 pages.

"First American Real Estate Solutions Experiences Record," PR Newswire, Nov. 4, 2002, 3 pages.

"First American Real Estate Solutions Releases ValuePoint4," PR Newswire, Oct. 21, 2002, 3 pages.

"First American Real Estate Solutions' ValuePoint(R)4 Experiences Explosive Growth in 2004—Leading Automated Valuation Model (AVM) Usage Grows More Than 700 Percent in 12-Month Period," PR Newswire, Mar. 24, 2005, 3 pages.

"Franchise Offering Circular for Prospective Franchisees," U.S. Appraisal, Nov. 1, 1986, 87 pages.

"GMAC-RFC Selects First American Real Estate Solutions' ValuePoint(R)4 Automated Valuation Model (AVM)," PR Newswire, Jun. 28, 2004, 3 pages.

"HNC Software and RealQuest Team to Provide Widespread Automated Property Valuation; Areas Users to Have Online Access to Texas MLS," Business Wire, Oct. 1, 1997, 3 pages.

"HomeAdvisor Ranks First in Gomez Poll," Realty Times, Jun. 13, 2001, 3 pages.

"HomeAdvisor Spin-Off Aims to Service Realty Industry," Directions on Microsoft, Apr. 24, 2000, 2 pages.

"HomeSeekers.com and MSN HomeAdvisor Provide Free Web Pages for All Real Estate Agents," PR Newswire, May 20, 1999, 3 pages.

"How do we value your home?," [online] CSWOnline, Retrieved from the Internet via the Wayback Machine dated Oct. 23, 1999, URL: http://w w w .csw online.com/method.shtml, 1 page.

"In Brief: HomeAdvisor Secures $100 Million in Equity Funding," Directions on Microsoft, Aug. 28, 2000, 1 page.

"Microsoft Real Estate Venture Gets Large Investment," The New York Times, Technology section, Aug. 23, 2000, 2 pages.

"MSN HomeAdvisor Becomes Most-Visited Home and Real Estate Web Site, According to Media Metrix," Microsoft News Center, Apr. 13, 2001, Retrieved from the Internet: URL: http://www.microsoft.com/enus/ news/press/2001/Apr01/04-13MarchTrafficPR.aspx?navV3Index=0, 2 pages.

(56) References Cited

OTHER PUBLICATIONS

"MSN HomeAdvisor Helps Real Estate Agents and Customers Feel Right at Home on the Internet," Microsoft News Center, Dec. 14, 1998, Retrieved from the Internet: URL: http://www.microsoft.com/enus/ news/features/1998/12-14msn.aspx?navV3Index=0, 2 pages.
"Nation's First Fully Interactive AVM Debuts in Las Vegas AVM News," PRweb press release, AVM News, Feb. 4, 2006, 1 page.
"NetNumina Solutions Creates Robust E-Business Solution for Leader in Real Estate Lending," PR Newswire, Aug. 16, 1999, 3 pages.
"Reis Inc.," Commercial Property News, vol. 18, Issue 6, Mar. 16, 2004, 2 pages.
"Reis, Inc. Launches Apartment Version of Online Valuation and Credit Risk Analysis Module," Business Wire, Nov. 7, 2002, 2 pages.
"RMBS: Guidelines for the Use of Automated Valuation Models for U.K. RMBS Transactions," Standard and Poors.com [online], Sep. 26, 2005 [retrieved Aug. 6, 2013], Retrieved from the Internet, S&P Archive: URL: www.standardandpoors.com/prot/ratings/articles/en/us/?articleType=HTML&assetID=1245330509010, 4 pages.
"Sample CASA Report," [online] CSWOnline, Retrieved from the Internet via the Wayback Machine dated Nov. 6, 1999, URL: http://w w w .csw online.com/sample.shtml, 3 pages.
"Standard on Automated Valuation Models (AVMs)", International Association of Assessing Officers, Approved Sep. 2003, 36 pages.
"The Appraisal" Report, U.S.Appraisal, dated at least by Sep. 29, 1983, 4 pages.
"The Appraiser," Certificate of Copyright Registration, Jun. 25, 1982, 4 pages.
"The Appraiser," Certificate of Copyright Registration, Oct. 19, 1981, 3 pages.
"The Assessor" Demo Video, U.S.Appraisal, [Accessed for review on Jun. 21, 2013, Zillow Inc. vs. Trulia Case No. 2:12-cv-01549-JLR], [Transcribed Oct. 8, 2013], 10 pages.
"The Assessor" Newsletter, US Appraisal, dated at least by Apr. 10, 1985, 4 pages.
"The Assessor" Source Code, U.S.Appraisal, [Accessed for review on Jun. 21, 2013, Zillow Inc. vs. Trulia Case No. 2:12-cv-01549-JLR], 2,460 pages.
"The Assessor," Certificate of Copyright Registration, Feb. 2, 1984, 2 pages.
"The Comprehensive R Archive Network,", www.crans-project.org, http://web.archive.org/web/20050830073913/cran.r-project.org/banner.shtml, [internet archive date: Aug. 30, 2005], pp. 1-2.
"The R Project for Statistical Computing," www.r-project.org, http://web.archive.org/web/20060102073515/www.r-project.org/main.shtml, [internet archive date: Jan. 2, 2006], 1 page.
"TransUnion Acquires Banton Technologies," PR Newswire, Oct. 20, 2003, 3 pages.
"TransUnion and CSW Form Partnership," Mortgage Banking, vol. 62, Issue 6, Mar. 31, 2002, 1 page.
"Trulia Estimates," [online], Retrieved from the Internet via the Wayback Machine dated Jan. 16, 2013, URL:http//www.trulia.com/trulia_estimates/, 2 pages.
"Uniform Standards of Professional Appraisal Practice and Advisory Opinions 2005 Edition<" Electronic USPAP 2005 Edition, Appraisal Standards Board, The Appraisal Foundation, Effective Jan. 1, 2005, 10 pages.
"USPAP Q&A," vol. 9, No. 6, The Appraisal Foundation, Jun. 2007, 2 pages.
"What Is an AVM?", Real-Info.com [online], Dec. 22, 2005 [retrieved on Aug. 6, 2013]. Retrieved from the Internet via Internet Archive Wayback Machine: URL: web.archive.org/web/20051222120807/http://www.real-info.com/products_avm.asp?RISID=e8fc23a9a1189fbff9b968e8f86ccde6], 3 pages.
Xactware Unveils Web-Based Valuation Tool for Underwriting, PR Newswire, Dec. 10, 2002, 3 pages.
"Xactware. (Central Utah)," Utah Business, vol. 17, Issue 3, Mar. 1, 2003, 1 page.
U.S. Appl. No. 11/927,623 by Humphries et al., filed Oct. 29, 2007.
U.S. Appl. No. 12/924,037 by Flint et al., filed Sep. 16, 2010.
U.S. Appl. No. 13/044,480 by Humphries et al., filed Mar. 9, 2011.
U.S. Appl. No. 13/044,490 by Humphries et al., filed Mar. 9, 2011.
U.S. Appl. No. 13/828,680 by Humphries et al., filed Mar. 14, 2013.
U.S. Appl. No. 13/830,497 by Humphries et al., filed Mar. 14, 2013.
U.S. Appl. No. 13/843,577 by Humphries et al., filed Mar. 15, 2013.
U.S. Appl. No. 14/041,450 by Humphries et al., filed Sep. 30, 2013.
U.S. Appl. No. 14/078,076 by Daimler et al., filed Nov. 12, 2013.
U.S. Appl. No. 14/325,094 by Bruce et al., filed Jul. 7, 2014.
U.S. Appl. No. 14/524,148 by Humphries et al., filed Oct. 27, 2014.
U.S. Appl. No. 14/640,860 by Rao et al., filed Mar. 6, 2015.
U.S. Appl. No. 14/704,567 by Wang et al., filed May 5, 2015.
U.S. Appl. No. 14/709,719 by Humphries et al., filed May 12, 2015.
U.S. Appl. No. 14/721,437 by Humphries et al., filed May 26, 2015.
U.S. Appl. No. 15/220,518 by VanderMey, filed Jul. 27, 2016.
U.S. Appl. No. 15/456,235 by VanderMey, filed Mar. 10, 2017.
Appeal Brief for U.S. Appl. No. 11/524,048, Aug. 9, 2010, 20 pages.
Assignment of Copyright to U.S.Appraisal by Flying Software, Inc., Jan. 2, 1982, 2 pages.
Australian Examiner's First Report in Australian Patent Application 2007216858, dated Dec. 22, 2008, 2 pages.
AVM News, Thomson Media, vol. 1, Issue 1 Jan. 2002, 23 pages.
AVM News, Thomson Media, vol. 1, Issue 10, Oct. 2002, 34 pages.
AVM News, Thomson Media, vol. 1, Issue 11, Nov. 2002, 28 pages.
AVM News, Thomson Media, vol. 1, Issue 12, Dec. 2002, 14 pages.
AVM News, Thomson Media, vol. 1, Issue 2, Feb. 2002, 13 pages.
AVM News, Thomson Media, vol. 1, Issue 3, Mar. 2002, 21 pages.
AVM News, Thomson Media, vol. 1, Issue 4, Apr. 2002, 24 pages.
AVM News, Thomson Media, vol. 1, Issue 5, May 2002, 35 pages.
AVM News, Thomson Media, vol. 1, Issue 6, Jun. 2002, 19 pages.
AVM News, Thomson Media, vol. 1, Issue 7, Jul. 2002, 24 pages.
AVM News, Thomson Media, vol. 1, Issue 8, Aug. 2002, 17 pages.
AVM News, Thomson Media, vol. 1, Issue 9, Sep. 2002, 15 pages.
AVM News, Thomson Media, vol. 10, Issue 1-2, Jan.-Feb. 2011, 72 pages.
AVM News, Thomson Media, vol. 10, Issue 11-12, Nov.-Dec. 2011, 70 pages.
AVM News, Thomson Media, vol. 10, Issue 3-4, Mar.-Apr. 2011, 100 pages.
AVM News, Thomson Media, vol. 10, Issue 5-6, May-Jun. 2011, 106 pages.
AVM News, Thomson Media, vol. 10, Issue 7-8, Jul.-Aug. 2011, 82 pages.
AVM News, Thomson Media, vol. 10, Issue 9-10, Sep.-Oct. 2011, 90 pages.
AVM News, Thomson Media, vol. 11, Issue 1-2, Jan.-Feb. 2012, 66 pages.
AVM News, Thomson Media, vol. 11, Issue 3-4, Mar.-Apr. 2012, 76 pages.
AVM News, Thomson Media, vol. 11, Issue 5-6, May-Jun. 2012, 72 pages.
AVM News, Thomson Media, vol. 2, Issue 1, Jan. 2003, 24 pages.
AVM News, Thomson Media, vol. 2, Issue 10, Oct. 2003, 31 pages.
AVM News, Thomson Media, vol. 2, Issue 11, Nov. 2003, 28 pages.
AVM News, Thomson Media, vol. 2, Issue 12, Dec. 2003, 18 pages.
AVM News, Thomson Media, vol. 2, Issue 2, Feb. 2003, 26 pages.
AVM News, Thomson Media, vol. 2, Issue 3, Mar. 2003, 29 pages.
AVM News, Thomson Media, vol. 2, Issue 4, Apr. 2003, 22 pages.
AVM News, Thomson Media, vol. 2, Issue 5, May 2003, 33 pages.
AVM News, Thomson Media, vol. 2, Issue 6, Jun. 2003, 38 pages.
AVM News, Thomson Media, vol. 2, Issue 7, Jul. 2003, 31 pages.
AVM News, Thomson Media, vol. 2, Issue 8, Aug. 2003, 24 pages.
AVM News, Thomson Media, vol. 2, Issue 9, Sep. 2003, 30 pages.
AVM News, Thomson Media, vol. 3, Issue 1, Jan. 2004, 24 pages.
AVM News, Thomson Media, vol. 3, Issue 10, Oct. 2004, 55 pages.
AVM News, Thomson Media, vol. 3, Issue 11, Nov. 2004, 54 pages.
AVM News, Thomson Media, vol. 3, Issue 12, Dec. 2004, 18 pages.
AVM News, Thomson Media, vol. 3, Issue 2, Feb. 2004, 26 pages.
AVM News, Thomson Media, vol. 3, Issue 3, Mar. 2004, 31 pages.
AVM News, Thomson Media, vol. 3, Issue 4, Apr. 2004, 36 pages.
AVM News, Thomson Media, vol. 3, Issue 5, May 2004, 37 pages.
AVM News, Thomson Media, vol. 3, Issue 6, Jun. 2004, 35 pages.
AVM News, Thomson Media, vol. 3, Issue 7, Jul. 2004, 49 pages.

(56) References Cited

OTHER PUBLICATIONS

AVM News, Thomson Media, vol. 3, Issue 8, Aug. 2004, 37 pages.
AVM News, Thomson Media, vol. 3, Issue 9, Sep. 2004, 31 pages.
AVM News, Thomson Media, vol. 4, Issue 1, Jan. 2005, 45 pages.
AVM News, Thomson Media, vol. 4, Issue 10, Oct. 2005, 51 pages.
AVM News, Thomson Media, vol. 4, Issue 11, Nov. 2005, 52 pages.
AVM News, Thomson Media, vol. 4, Issue 12, Dec. 2005, 56 pages.
AVM News, Thomson Media, vol. 4, Issue 2, Feb. 2005, 31 pages.
AVM News, Thomson Media, vol. 4, Issue 3, Mar. 2005, 39 pages.
AVM News, Thomson Media, vol. 4, Issue 4, Apr. 2005, 40 pages.
AVM News, Thomson Media, vol. 4, Issue 5, May 2005, 51 pages.
AVM News, Thomson Media, vol. 4, Issue 6, Jun. 2005, 34 pages.
AVM News, Thomson Media, vol. 4, Issue 7, Jul. 2005, 53 pages.
AVM News, Thomson Media, vol. 4, Issue 8, Aug. 2005, 30 pages.
AVM News, Thomson Media, vol. 4, Issue 9, Sep. 2005, 48 pages.
AVM News, Thomson Media, vol. 5, Issue 1, Jan. 2006, 58 pages.
AVM News, Thomson Media, vol. 5, Issue 10, Oct. 2006, 85 pages.
AVM News, Thomson Media, vol. 5, Issue 11, Nov. 2006, 86 pages.
AVM News, Thomson Media, vol. 5, Issue 12, Dec. 2006, 54 pages.
AVM News, Thomson Media, vol. 5, Issue 2, Feb. 2006, 53 pages.
AVM News, Thomson Media, vol. 5, Issue 3, Mar. 2006, 41 pages.
AVM News, Thomson Media, vol. 5, Issue 4, Apr. 2006, 54 pages.
AVM News, Thomson Media, vol. 5, Issue 5, May 2006, 48 pages.
AVM News, Thomson Media, vol. 5, Issue 6, Jun. 2006, 62 pages.
AVM News, Thomson Media, vol. 5, Issue 7, Jul. 2006, 74 pages.
AVM News, Thomson Media, vol. 5, Issue 8, Aug. 2006, 57 pages.
AVM News, Thomson Media, vol. 5, Issue 9, Sep. 2006, 63 pages.
AVM News, Thomson Media, vol. 6 Issue 3, Mar. 2007, 49 pages.
AVM News, Thomson Media, vol. 6, Issue 1, Jan. 2007, 42 pages.
AVM News, Thomson Media, vol. 6, Issue 10, Oct. 2007, 52 pages.
AVM News, Thomson Media, vol. 6, Issue 11, Nov. 2007, 23 pages.
AVM News, Thomson Media, vol. 6, Issue 2, Feb. 2007, 47 pages.
AVM News, Thomson Media, vol. 6, Issue 4, Apr. 2007, 59 pages.
AVM News, Thomson Media, vol. 6, Issue 5, May 2007, 66 pages.
AVM News, Thomson Media, vol. 6, Issue 6, Dec. 2007, 38 pages.
AVM News, Thomson Media, vol. 6, Issue 6, Jun. 2007, 46 pages.
AVM News, Thomson Media, vol. 6, Issue 8, Aug. 2007, 35 pages.
AVM News, Thomson Media, vol. 6, Issue 9, Sep. 2007, 37 pages.
AVM News, Thomson Media, vol. 6, Issue7, Jul. 2007, 51 pages.
AVM News, Thomson Media, vol. 7, Issue 07-08, Jul.-Aug. 2008, 56 pages.
AVM News, Thomson Media, vol. 7, Issue 1, Jan. 2008, 44 pages.
AVM News, Thomson Media, vol. 7, Issue 11-12, Nov.-Dec. 2008, 52 pages.
AVM News, Thomson Media, vol. 7, Issue 2, Feb. 2008, 35 pages.
AVM News, Thomson Media, vol. 7, Issue 3, Mar. 2008, 34 pages.
AVM News, Thomson Media, vol. 7, Issue 4, Apr. 2008, 33 pages.
AVM News, Thomson Media, vol. 7, Issue 4-5, May-Jun., 2008, 46 pages.
AVM News, Thomson Media, vol. 7, Issue 9-10, Sep.-Oct. 2008, 68 pages.
AVM News, Thomson Media, vol. 8, Issue 1-2, Jan.-Feb. 2009, 71 pages.
AVM News, Thomson Media, vol. 8, Issue 11-12, Nov.-Dec. 2009, 62 pages.
AVM News, Thomson Media, vol. 8, Issue 3-4, Mar.-Apr. 2009, 45 pages.
AVM News, Thomson Media, vol. 8, Issue 5-6, May-Jun. 2009, 65 pages.
AVM News, Thomson Media, vol. 8, Issue 7-8, Jul.-Aug. 2009, 71 pages.
AVM News, Thomson Media, vol. 8, Issue 9-10, Sep.-Oct. 2009, 53 pages.
AVM News, Thomson Media, vol. 9, Issue 1-2, Jan.-Feb. 2010, 66 pages.
AVM News, Thomson Media, vol. 9, Issue 11-12, Nov.-Dec. 2010, 75 pages.
AVM News, Thomson Media, vol. 9, Issue 3-4, Mar.-Apr. 2010, 63 pages.
AVM News, Thomson Media, vol. 9, Issue 5-6, May-Jun. 2010, 69 pages.
AVM News, Thomson Media, vol. 9, Issue 7-8, Jul.-Aug. 2010, 63 pages.
AVM News, Thomson Media, vol. 9, Issue 9-10, Sep.-Oct. 2010, 69 pages.
Bailey, Martin J. et al., A Regression Method for Real Estate Price Index Construction, Journal of the American Statistical Association, vol. 58, No. 304 (Dec. 1963), Published by: American Statistical Association, Stable URL: http://www.jstor.org/stable/2283324, pp. 933-942, 11 pages.
Basch, Mark, "Basis100 Sold to California Firm," The Florida Times Union, Jacksonville.com, Jul. 1, 2004, 2 pages.
Bennett, Kristin P. et al.., "Support Vector Machines: Hype or Hallelujah?" SIGKDD Explorations, Dec. 2000, vol. 2, issue 2, ACM SIGKDD, 13 pages.
Borst, Richard A. et al., "An Evaluation of Multiple Regression Analysis, Comparable Sales Analysis and Artificial Neural Networks for the Mass Appraisal of Residential Properties in Northern Ireland," 1996, 16 pages.
Borst, Richard A. et al., "Use of GIS to Establish and Update CAMA Neighborhoods in Northern Ireland," Available prior to Sep. 1997, 9 pages.
Borst, Richard A., "A Valuation and Value Updating of Geographically Diverse Commercial Properties Using Artificial Neural Networks," 1993, 2 pages.
Borst, Richard A., "Computer Assisted Mass Appraisal, a New Growth Industry in the United States," Accessed from International Association of Assessing Officers Research and Technical Services Department, Document 00994, Dated no later than Jun. 8, 1979, 28 pages.
Borst, Richard A., "The Common Thread in Market Data Systems," World Congress on Computer-Assisted Valuation, Aug. 1-6, 1982, 14 pages.
Boston Housing Data, http://www.ics.uci.edu/~mlearn/databases/housing/housing.names, [accessed Dec. 13, 2005], 1 page.
Breiman et al., "Random Forest," Classification Description, http://www.stat.berkeley.edu/users/breiman/RandomForests/cc_home.htm, [accessed Dec. 13, 2005], pp. 1-28.
Breiman, L., "Random Forests," Machine Learning, 45, 2001, Kluwer Academic Publishers, The Netherlands, pp. 5-32.
Breiman, Leo et al., Random Forests, R Mathematical Software Package, licensed by Salford Systems, available at URL cran.r-project.org, and described at "Package TandomForest", version 4.6-7, Feb. 15, 2013, Published Oct. 16, 2012, available at URL cran.r-project.org/web/packages/randomforest/randomForest.pdf., 29 pages.
Calhoun, Charles A., "Property Valuation Methods and Data in the United States," Housing Finance International Journal 16.2, Dec. 2001, pp. 12-23.
Casa Property Valuation screen capture, dated at least by Jan. 24, 2005, 1 page.
Case, Karl E., et al., "Prices of Single Family Homes Since 1970: New Indexes for Four Cities," Cowles Foundation for Research in Economics at Yale University, New Haven, Connecticut, Discussion Paper No. 851, Oct. 1987, 54 pages.
CDR Business Solutions, LLC, What is RELAR, <http://www.relar.com/relarsystem.aspx> Aug. 24, 2011, Archived by Internet Wayback Machine <http://web.archive.org/web/20110824084613/http://www.relarcom/relarsystem.aspx> viewed Aug. 20, 2015, pp. 1-4.
Centre for Mathematical Sciences, Lund University, "Classification and Regression with Random Forest," http://web.archive.org/web/20060205051957/http://www.maths.lth.se/help/R/.R/library/randomForest/html/randomForest.html, [internet archive date: Feb. 5, 2006], pp. 1-4.
Complaint for Patent Infringement, Demand for Jury Trial for U.S. Pat. No. 7,970,674, Case 2:12-cv-01549-JLR, Sep. 12, 2012, 8 pages.
Cozzi, Guy, Real Estate Appraising from A to Z, 4th Edition, Nemmar Real Estate Training, Jan. 1, 2002, 226 pages, Parts 1-2.
Crowston, Kevin, et al., "Real Estate War in Cyberspace: an Emerging Electronic Market?," Syracuse University Surface, School of Information Studies (iSchool), Jan. 1, 1999, 14 pages.

(56) References Cited

OTHER PUBLICATIONS

Curriculum Vitae of Steven R. Kursh, Ph.D., CSDP, CLP, Aug. 2013, 9 pages.
Cypress Software Introduces AVM Module for Mark IV Application; Module Provides Instant Home Appraisal for Loans Processed by the Loan-Decisioning Platform, Business Wire, Nov. 15, 2005, 2 pages.
Decision—Institution of Covered Business Method Patent Review for U.S. Pat. No. 7,970,674, Case CBM2013-00056, Entered Mar. 10, 2014, 36 pages.
Decision—Institution of Inter Partes Review for U.S. Pat. No. 7,970,674, Case No. IPR2013-00034, Apr. 2, 2013, 28 pages.
Decision on Appeal for U.S. Appl. No. 11/524,048, dated Oct. 19, 2012, 7 pages.
Decision on Request for Rehearing for U.S. Pat. No. 7,970,674, Case No. IPR2013-00034, Apr. 22, 2013, 5 pages.
Declaration Brooke A.M. Taylor in Support of Plaintiff Vasudevan Software, Inc.'s Motion for Sanctions Against Microstrategy, Case No. 3:11-06637-RS-PSG, Nov. 20, 2012, 3 pages.
Declaration of Dr. Richard Borst, Aug. 26, 2013, 43 pages.
Declaration of John Kilpatrick, Case No. IPR2013-00034, Jun. 14, 2013, 23 pages.
Declaration of Jordan Connors in Support of Plaintiff Vasudevan Software, Inc.'s Motion for Sanctions Against Microstraqtegy, Case No. 3:11-06637-RS-PSG, Nov. 20, 2012, 4 pages.
Declaration of Leslie V. Payne in Support of Plaintiff Vasudevan Software, Inc.'s Motion for Sanctions Against Microstrategy, Case No. 3:11-06637-RS-PSG, Nov. 20, 2012, 3 pages.
Declaration of Steven R. Kursh, Ph.D., CSDP, CLP, CBM 2013-00056, Filed Sep. 11, 2013, 108 pages.
Declaration of Steven R. Kursh, Ph.D., CSDP, CLP, CBM2014-00115, Filed Apr. 10, 2014, 108 pages.
Defendant Trulia, Inc.'s Answer to Complaint for Patent Infringement and Counterclaim, Demand for Jury Trial, Case No. 2:12-cv-01549-JLR, Mar. 1, 2013, 10 pages.
Defendant Trulia, Inc.'s Non-Infringement and Invalidity Contentions, Case No. 2:12-cv-01549-JLR, Jun. 21, 2013, 24 pages.
Defendant Trulia, Inc.'s Non-Infringement and Invalidity Contentions, Exhibit A, Case No. 2:12-cv-01549-JLR, Jun. 21, 2013, 267 pages.
Dempster, A.P. et al., "Maximum Likelihood from Incomplete Data via the Algorithm," Journal of the Royal Statistical Society, 1977, Series B 39 (1): 1-38, JSTOR 2984875, MR 0501537, [online], Retrieved from the Internet: URL: http://www.jstor.org/stable/2984875?origin=JSTOR-pdf, 38 pages.
Department of the Treasury, Internal Revenue Service, "How to Depreciate Property," Publication 946, made available at www.irs.gov by dated at least 2004, 112 pages.
Deposition Transcription of John A. Kilpatrick, Ph.D., Aug. 8, 2013, 263 pages.
European Examination Report, Application No. 07018380.1, dated May 16, 2013, 6 pages.
European Examination Report, Application No. 07018380.1, dated Oct. 24, 2008, 6 pages.
European Examination Report, Application No. 07018380.1, dated Nov. 8, 2012, 6 pages.
Evaluation Services, Inc. Warranty to Lender's Service, Inc., dated at least by Feb. 12, 1997, 144 pages.
Evans, Blanche, "Microsoft HomeAdvisor: Software Giant, Real Estate Portal," Realty Times, Mar. 30, 2000, 3 pages.
Evans, Blanche, The Hottest E-careers in Real Estate, Dearborn Financial Publishing Inc., 2000, 241 pages.
Examiner's Answer for U.S. Appl. No. 11/524,048, dated Oct. 28, 2010, 13 pages.
Fannie Mae Form 2055, Federal National Mortgage Association [online], Mar. 2005, Retrieved from the Internet: URL: https://www.fanniemae.com/content/guide_form/2055.pdf, 8 pages.
Fannie Mae Form 2075, Desktop Underwriter Property Inspection Report, Federal National Mortgage Association [online], not dated, Retrieved from the Internet: URL: https://www.fanniemae.com/content/guide_form/2075.pdf, 3 pages.
Feldman, David et al., "Mortgage Default: Classification Trees Analysis," The Pinhas Sapir Center for Development Tel-Aviv University, Discussion Paper No. Mar. 2003, Oct. 2003, 46 pages.
FHFA, "Distress-Free House Price Indexes." https://www.fhfa.gov/DataTools/Downloads/Documents/HPI_Focus_Pieces/2012Q2_HPI_N508.pdf. Jul. 13, 2014.
File History of U.S. Pat. No. 7,970,674, dated Feb. 3, 2006-Apr. 2, 2013, 404 pages, Parts 1-4.
Final Office Action for U.S. Appl. No. 11/347,000, dated Jan. 3, 2012, 17 pages.
Final Office Action for U.S. Appl. No. 11/347,024, dated Feb. 3, 2011, 28 pages.
Final Office Action for U.S. Appl. No. 11/524,047, dated Jul. 23, 2010, 7 pages.
Final Office Action for U.S. Appl. No. 11/524,047, dated Sep. 28, 2012, 8 pages.
Final Office Action for U.S. Appl. No. 11/524,047, dated Jun. 12, 2015, 31 pages.
Final Office Action for U.S. Appl. No. 11/524,048, dated Dec. 8, 2009, 11 pages.
Final Office Action for U.S. Appl. No. 13/044,480, dated Feb. 19, 2014, 31 pages.
Final Office Action for U.S. Appl. No. 13/044,480, dated Jul. 10, 2015, 35 pages.
Final Office Action for U.S. Appl. No. 13/044,490, dated Mar. 14, 2013, 35 pages.
Final Office Action for U.S. Appl. No. 13/044,490, dated May 7, 2015, 36 pages.
Final Office Action for U.S. Appl. No. 13/417,804, dated Aug. 13, 2014, 14 pages.
Final Office Action for U.S. Appl. No. 13/943,604, dated Mar. 6, 2015, 28 pages.
Final Office Action for U.S. Appl. No. 14/167,962, dated Sep. 30, 2015, 13 pages.
Final Office Action for U.S. Appl. No. 14/191,388, dated Dec. 15, 2014, 12 pages.
Final Office Action for U.S. Appl. No. 14/318,536, dated Dec. 11, 2014, 47 pages.
Final Office Action for U.S. Appl. No. 11/927,623, dated Sep. 19, 2011, 13 pages.
Final Office Action for U.S. Appl. No. 11/927,623, dated Nov. 3, 2016, 15 pages.
Final Office Action for U.S. Appl. No. 12/924,037, dated May 16, 2013, 11 pages.
Final Office Action for U.S. Appl. No. 12/924,037, dated Jun. 16, 2015, 19 pages.
Final Office Action for U.S. Appl. No. 13/044,490, dated Mar. 29, 2017, 7 pages.
Final Office Action for U.S. Appl. No. 13/417,804, dated Oct. 14, 2015, 11 pages.
Final Office Action for U.S. Appl. No. 13/828,680, dated Jul. 26, 2016, 59 pages.
Final Office Action for U.S. Appl. No. 13/843,577, dated Mar. 22, 2016, 63 pages.
Final Office Action for U.S. Appl. No. 14/078,076, dated Feb. 26, 2016, 21 pages.
Final Written Decision for U.S. Pat. No. 7,970,674, Case IPR2013-00034, Entered Mar. 27, 2014, 44 pages.
Finkelstein, Brad, "PlatinumData Improving Value of Its Information," Origination News and SourceMedia, Inc., vol. 15, Section: Special Report, Section:2, Nov. 1, 2005, 2 pages.
First American Real Estate Solutions Releases ValuePoint4, AVM News, Thomson Media, vol. 1, Issue 10, Oct. 2002, pp. 28-29.
Fletcher, June, "High-Tech Is Coming for High-End House Sales," Wall Street Journal, Sep. 19, 1997, 1 page.
Fletcher, June, "On the Web: What's Your House Worth?," Wall Street Journal, Sep. 26, 1997, 1 page.
Fletcher, Jun., "Touring the Tangled Web of For-Sale-by-Owner Homes," The Wall Street Journal, Jun. 6, 1997, 1 page.
Freddie Mac Form 70, Uniform Residential Appraisal Report, Federal Home Loan Mortgage Corporation [online], Mar. 2005,

(56) References Cited

OTHER PUBLICATIONS

Retrieved from the Internet: URL: https://www.fanniemae.com/content/guide_form/1004.pdf, 8 pages.
Freddie Mac's Home Value Explorer screen capture, dated at least by Jul. 15, 2003, 1 page.
Google, Google Trends, retrieved from the internet Oct. 12, 2015 <http://www.google.com/trends> (website address only—No document).
Great Britain Examination Report in Application No. GB0701944.1, dated May 5, 2010, 3 pages.
Great Britain Search Report for GB0701944.1, dated Mar. 23, 2007, 3 pages.
Hill, T. and Lewicki, P., "K-Nearest Neighbors," Statistics Methods and Applications, 2007, http://www.statsoft.com/textbook/stknn.html, [internet accessed on [Dec. 6, 2007], 5 pages.
Hochgraf, Lisa, "Tools for Top Speed," Credit Union Management, vol. 26, Issue 8, Aug. 1, 2003, 4 pages.
HomeSearch Report, [online], Retrieved from the Internet via the Wayback Machine dated Dec. 10, 2005 on Jun. 19, 2013, URL: http://homesmartreports.com/samples/samplehomesearch.htm, 3 pages.
HomeSmart About, [online], Retrieved from the Internet via the Wayback Machine dated Dec. 10, 2005 http://homesmartreports.com/hs_about.htm, 2 pages.
HomeSmart Reports, [online], Retrieved from the Internet via the Wayback Machine dated Dec. 10, 2005 on Jun. 19, 2013, URL: http://homesmartreports.com/default.aspx, 1 page.
HomeSmart Sellers, [online], Retrieved from the Internet via the Wayback Machine dated Dec. 10, 2005 on Jun. 19, 2013, URL: http://homesmartreports.com/hs_owners.htm, 1 page.
HomeSmart Terms of Use, [online], Retrieved from the Internet via the Wayback Machine dated Dec. 10, 2005 on Jun. 19, 2013, URL: http://homesmartreports.com/hs_disclaimer.htm, 3 pages.
HomeSmartReports, [online], Retrieved from the Internet via the Wayback Machine dated Oct. 13, 2005 on Jun. 19, 2013, URL: http://homesmartreports.com/, 2 pages.
Indeed, Job Trends: Podcast, retrieved from the internet Oct. 12, 2015 <http://www.indeed.com/jobtrends> (website only—No document).
Infinite Regression, Certificate of Copyright Registration Filing, Apr. 2, 1984, 3 pages.
Inman, "Zilpy, the new 'Z' site in online real estate", published Feb. 7, 2008, retrieved from http://www.inman.com/2008/02/07/zilpy-new-z-site-in-online-real-estate/ on Aug. 11, 2016, 2 pages.
Jensen, David L., "Alternative Modeling Techniques in Computer-Assisted Mass Appraisal," Property Tax Journal, vol. 6, No. 3, Sep. 1987, pp. 193-237.
Jobster, Job Search Trends for Keywords and Locations, retrieved from the internet Oct. 12, 2015 <http://www.jobster.com/find/US/jon/search/trends> (website only—No document).
John Battelle's Searchblog,: The Database of Intentions, Nov. 13, 2003.
Kilpatrick, John A., "The Future of Real Estate Information," Real Estate Issues, Spring 2001, 8 pages.
Kilpatrick, John A., et al., "House Price Impacts of School District Choice," South Carolina Center for Applied Real Estate Education and Research, Dec. 28, 1998, 25 pages.
Krasilovsky, Peter, "Chris Terrill Discusses ServiceMagic's Rebranding to 'Home Advisor,'" Home Advisor, Oct. 17, 2012, 5 pages.
Lankarge, Vicki, et al., How to Increase the Value of Your Home: Simple, Budget-Conscious Techniques and Ideas That Will Make Your Home Worth Up to $100,000 More!, McGraw-Hill, 2004, 176 pages.
Leonhardt, David, The Internet Knows What You'll Do Next, Jul. 5, 2006, http://www.nytimes.com/2006/07/05/business/05leonhardt.html?ex=1309752000&en=8be0be92819a6f8f&ei=5088&partner=rssnyt&emc=rss.
McCluskey, William J. et al., "An Evaluation of Mra, Comparable Sales Analysis, and ANNs for the Mass Appraisal of Residential Properties in Northern Ireland," Assessment Journal, Jan./Feb. 1997, 8 pages.

Mcgarity, M., "The Values Debate," Mortgage Banking, vol. 65, Issue 6, Mar. 1, 2005, 14 pages.
McWilliams, Charlyne H., "The Tale of AVMs," Mortgage Banking, vol. 64, Issue 5, Feb. 1, 2004, 7 pages.
Melville, J., "How much should I charge to rent my house?", published Dec. 5, 2010, retrieved from http://homeguides.sfgate.com/much-should-charge-rent-house-8314.html on Aug. 11, 2016, 2 pages.
Meyer, Robert T., "The Learning of Multiattribute Judgment Policies," The Journal of Consumer Research, vol. 14, No. 2, Sep. 1987, 20 pages.
Microstrategy Inc.'s Opposition to Plaintiff Vasudevan Software, Inc.'s Motion for Sanctions, Case No. 11-CV-06637-RS-PSG, Jan. 4, 2013, 23 pages.
Miller et al., A Note on Leading Indicators of Housing Market Price Trends, vol. 1, No. 1, 1986.
Miller et al., Multiple Regression Condominium Valuation with a Touch of Behavioral Theory, The Appraisal Journal 1987.
Miller et al., Pricing Strategies and Residential Property Selling Prices, The Journal of Real Estate Research, vol. 2, No. 1, Nov. 1, 1987.
Miller et al., The Impact of Interest Rates and Employment on Nominal Housing Prices, International Real Estate Review, vol. 8 No. 1, pp. 26-42, 2005.
Mobasher B. "Classification Via Decision Trees in WEKA," DePaul University, Computer Science, Telecommunications, and Information Systems, ECT 584—Web Data Mining, 2005, http://maya.cs.depaul.edu/~classes/Ect584/WEKA/classify.html, [internet accessed on Dec. 6, 2007], 5 pages.
Morton, T. Gregory, Regression Analysis Appraisal Models: Selected Topics and Issues, Center for Real Estate and Urban Economic Studies, University of Connecticut, Real Estate Report: No. 19, Oct. 1976, 85 pages.
Motion for Pro Hac Vice Admission and Exhibit a for U.S. Pat. No. 7,970,674, Case No. IPR2013-00034, Filing Date Dec. 17, 2012, 13 pages.
MRMLS Realist Tax System Foreclosure User Guide, crmls.org/help/realist_manuals/realist_foreclosure.pdf. Oct. 30, 2007.
MSN House & Home—More Useful Everyday screen capture, [online], Retrieved from the Internet via the Wayback Machine dated Mar. 23, 2003 on Jun. 19, 2013, URL: http://web.archive.org/web/20030323183505/http://houseandhome.msn.com/, 2 pages.
Mullaney, Timothy J., "A new Home Site on the Block," Bloomberg Businessweek [online], Feb. 7, 2006, Retrieved from the Internet: URL: http://www.businessweek.com/stories/2006-02-07/a-new-home-site-on-the-block, 3 pages.
Munarriz, Rick A., "Pop Goes the Bubble," The Motley Fool, Fool.com [online] Feb. 14, 2006, Retrieved from the Internet; URL: http://www.fool.com/investing/small-cap/2006/02/14/pop-goes-the-bubble.aspx, 4 pages.
Non-Final Office Action for U.S. Appl. No. 11/524,047, dated May 7, 2012, 7 pages.
Non-Final Office Action for U.S. Appl. No. 11/524,047, dated Nov. 4, 2013, 8 pages.
Non-Final Office Action for U.S. Appl. No. 13/044,480, dated Oct. 24, 2013, 29 pages.
Non-Final Office Action for U.S. Appl. No. 11/347,000, dated Oct. 27, 2010, 23 pages.
Non-Final Office Action for U.S. Appl. No. 11/347,000, dated Nov. 23, 2012, 6 pages.
Non-Final Office Action for U.S. Appl. No. 11/347,000, dated Apr. 9, 2010, 18 pages.
Non-Final Office Action for U.S. Appl. No. 11/347,000, dated May 27, 2011, 13 pages.
Non-Final Office Action for U.S. Appl. No. 11/347,024, dated Dec. 10, 2009, 45 pages.
Non-Final Office Action for U.S. Appl. No. 11/347,024, dated May 13, 2010, 33 pages.
Non-Final Office Action for U.S. Appl. No. 11/524,047, dated Dec. 1, 2014, 26 pages.
Non-Final Office Action for U.S. Appl. No. 11/524,047, dated Oct. 28, 2009, 8 pages.

(56) References Cited

OTHER PUBLICATIONS

Non-Final Office Action for U.S. Appl. No. 11/524,047, dated Jul. 8, 2011, 7 pages.
Non-Final Office Action for U.S. Appl. No. 11/524,048, dated Apr. 29, 2009, 10 pages.
Non-Final Office Action for U.S. Appl. No. 11/927,623, dated Jan. 11, 2016, 13 pages.
Non-Final Office Action for U.S. Appl. No. 11/927,623, dated Dec. 28, 2010, 10 pages.
Non-Final Office Action for U.S. Appl. No. 11/971,758, dated Feb. 2, 2011, 22 pages.
Non-Final Office Action for U.S. Appl. No. 13/044,480, dated Jul. 17, 2014, 31 pages.
Non-Final Office Action for U.S. Appl. No. 13/044,480, dated Mar. 12, 2015, 32 pages.
Non-Final Office Action for U.S. Appl. No. 13/044,490, dated Jan. 14, 2016, 18 pages.
Non-Final Office Action for U.S. Appl. No. 13/044,490, dated Dec. 17, 2014, 30 pages.
Non-Final Office Action for U.S. Appl. No. 13/044,490, dated Oct. 11, 2012, 30 pages.
Non-Final Office Action for U.S. Appl. No. 13/417,804, dated Jan. 28, 2015, 12 pages.
Non-Final Office Action for U.S. Appl. No. 13/417,804, dated Feb. 26, 2014, 13 pages.
Non-Final Office Action for U.S. Appl. No. 13/828,680, dated Dec. 15, 2015, 42 pages.
Non-Final Office Action for U.S. Appl. No. 13/830,497, dated Sep. 14, 2016, 52 pages.
Non-Final Office Action for U.S. Appl. No. 13/843,577, dated Sep. 24, 2015, 50 pages.
Non-Final Office Action for U.S. Appl. No. 13/843,577, dated Dec. 19, 2016, 80 pages.
Non-Final Office Action for U.S. Appl. No. 13/943,604, dated Nov. 19, 2014, 24 pages.
Non-Final Office Action for U.S. Appl. No. 14/078,076, dated Oct. 19, 2016, 29 pages.
Non-Final Office Action for U.S. Appl. No. 14/167,962, dated Mar. 3, 2015, 26 pages.
Non-Final Office Action for U.S. Appl. No. 14/167,962, dated Oct. 31, 2014, 23 pages.
Non-Final Office Action for U.S. Appl. No. 14/191,388, dated Aug. 7, 2014, 5 pages.
Non-Final Office Action for U.S. Appl. No. 14/318,536, dated Aug. 8, 2014, 38 pages.
Non-Final Office Action for U.S. Appl. No. 12/924,037, dated Nov. 17, 2014, 13 pages.
Non-Final Office Action for U.S. Appl. No. 12/924,037, dated Jan. 10, 2013, 9 pages.
Non-Final Office Action for U.S. Appl. No. 12/924,037, dated Nov. 10, 2016, 19 pages.
Non-Final Office Action for U.S. Appl. No. 12/924,037, dated May 27, 2014, 14 pages.
Non-Final Office Action for U.S. Appl. No. 13/044,480, dated Aug. 17, 2016, 40 pages.
Non-Final Office Action for U.S. Appl. No. 13/044,490, dated Jul. 22, 2016, 11 pages.
Non-Final Office Action for U.S. Appl. No. 14/041,450, dated Aug. 18, 2016, 48 pages.
Non-Final Office Action for U.S. Appl. No. 14/078,076, dated Aug. 14, 2015, 15 pages.
Notice of Allowability and Examiner-Initiated Interview Summary for U.S. Appl. No. 11/524,048, dated Jul. 3, 2013, 11 pages.
Notice of Allowance for U.S. Appl. No. 11/347,024, dated Apr. 18, 2011, 7 pages.
Notice of Allowance for U.S. Appl. No. 11/524,048, dated Feb. 25, 2013, 14 pages.
Notice of Allowance for U.S. Appl. No. 11/971,758, dated Nov. 10, 2011, 12 pages.
Notice of Allowance for U.S. Appl. No. 11/347,000, dated Oct. 24, 2013, 12 pages.
Notice of Allowance for U.S. Appl. No. 11/524,048, dated Jul. 18, 2013, 10 pages.
Notice of Allowance for U.S. Appl. No. 13/417,804, dated Aug. 18, 2016, 15 pages.
Notice of Allowance for U.S. Appl. No. 14/191,388, dated Jun. 25, 2014, 9 pages.
Notice of Appeal for U.S. Pat. No. 7,970,674, Case IPR2013-00034, May 1, 2014, 5 pages.
O'Brien, Jeffrey M., "What's Your House Really Worth?," Fortune [online], Feb. 15, 2007, Retrieved from the Internet: URL: http://money.cnn.com/magazines/fortune/fortune_archive/2007/02/19/8400262/index.htm, 6 pages.
Oldham, Jennifer, "Pricing's Tangled Web, Consumers Using the Internet to Calculate Home Values Find that the Results—and Data They're Based on—Vary," Los Angeles Times, Jul. 30, 2000, 5 pages.
One-month Office Action for U.S. Appl. No. 11/347,000, dated Jul. 26, 2013, 6 pages.
Oral Hearing Petitioner Demonstratives, Patent 7,970,674, Case IPR2013-00034, Email Date Nov. 14, 2013, 85 pages.
Oral Hearing Transcript for U.S. Pat. No. 7,970,674, Case IPR2013-00034, Held Nov. 21, 2013, Entered Feb. 20, 2014, 96 pages.
Order Authorizing Motion for Pro Hac Vice Admission for U.S. Pat. No. 7,970,674, Case No. IPR2013-00034, Filing Date Jan. 3, 2013, 4 pages.
Pagourtzi, E. et al., "Real Estate Appraisal: A Review of Valuation Methods," Journal of Property Investment & Finance, vol. 21, No. 4, 2003, pp. 383-401.
Palmquist, Raymond B., "Alternative Techniques for Developing Real Estate Price Indexes," The Review of Economics and Statistics, vol. 62, No. 3 (Aug. 1980), pp. 442-448.
Pass screen capture, dated at least by Oct. 20, 2004, 1 page.
Patent Owner's Demonstrative Exhibit for Oral Hearing, Patent 7,970,674, Case IPR2013-00034, Exhibit 2023, Email Date Nov. 21, 2013, 56 pages.
Patent Owner's Observations on Cross Examination of Dr. Richard A. Borst, Ph.D., U.S. Pat. No. 7,970,674, Case IPR2013-00034, Oct. 10, 2013, 9 pages.
Patent Owner's Response to Revised Petition for Inter Partes Review for U.S. Pat. No. 7,970,674, Case No. IPR2013-00034, Jun. 14, 2013, 41 pages.
Patent Owner's Response to the Petition for Covered Business Method Patent Review for U.S. Pat. No. 7,970,674, Case No. CBM2013-00056, Jun. 20, 2014, 72 pages.
Petition for Covered Business Method Patent Review for U.S. Pat. No. 7,970,674, CBM2013-00056, Sep. 11, 2013, 87 pages.
Petition for Covered Business Method Patent Review for U.S. Pat. No. 7,970,674, CBM2014-00115, Apr. 10, 2014, 69 pages.
Petition for Inter Partes Review for U.S. Pat. No. 7,970,674, Case No. IPR2013-00034, Mail Date Oct. 26, 2012, 65 pages.
Petitioner Response to Patent Owner's Observations on Cross Examination of Dr. Richard A. Borst, Ph.D., Patent 7,970,674, Case IPR2013-00034, Oct. 24, 2013, 7 pages.
Petitioner's Reply to Patent Owner Response to Petition, U.S. Pat. No. 7,970,674, Case No. IPR2013-00034, Aug. 26, 2013, 20 pages.
Plaintiff Vasudevan Software, Inc.'s Notice of Motion and Motion for Sanctions Against Microstrategy, Case No. 3:11-06637-RS-PSG, Dec. 12, 2012, 23 pages.
Plaintiff Vasudevan Software, Inc.'s Reply in Support of Motion for Sanctions Against Microstrategy, Case No. 3:11-06637-RS-PSG, Jan. 24, 2013, 25 pages.
Potharst, R. et al., "Classification Trees for Problems with Monotonicity Constraints," ACM SIGKDD Explorations Newsletter 4.1, 2002, pp. 1-10.
Potharst, R. et al., "Classification Trees for Problems with Monotonicity Constraints," ERIM Report Series Research in Management, Erasmus Research Institute of Management, Apr. 2002, 39 pages.
PowerBase 6.0 screen capture, dated at least by Oct. 20, 2004, 1 page.

(56) References Cited

OTHER PUBLICATIONS

Prasad, Nalini et al., "Measuring Housing Price Growth—Using Stratification to Improve Median-based Measures", Reserve Bank of Australia, 2006, p. 1.
Preliminary Patent Owner Response and Exhibits for U.S. Pat. No. 7,970,674, Case No. IPR2013-00034, Feb. 15, 2013, 228 pages.
Preliminary Patent Owner Response for U.S. Pat. No. 7,970,674, Case No. CBM2013-00056, Dec. 18, 2013, 85 pages.
Preliminary Patent Owner Response for U.S. Pat. No. 7,970,674, Case No. IPR2013-00034, Feb. 15, 2013, 39 pages.
Quinlan, Ross J., "C4.5: Programs for Machine Learning," Machine Learning, 1993, Morgan Kaufmann Publishers, San Francisco, CA, USA., 302 pages. Book to be mailed to USPTO.
Quirk, B., "Zilpy.com launches a rental data website built in partnership with Zillow!!!", published Jan. 29, 2008, retrieved from http://www.propertymanagementmavens.com/archives/2008/1 on Aug. 11, 2016, 3 pages.
Real Info Inc., Relar Sample Report, <http://www.real-info.com/products_RELAR.asp> Aug. 18, 2010, Archived by Internet Wayback Machine <http://web.archive.org/web/20100818012252/http://www.real-info.com/products_RELAR.asp> viewed Aug. 24, 2015, pp. 1-4.
Real-info.com, "What is an AVM," www.real-info.com/products_avm.asp? Internet Archive Date: Oct. 30, 2005, [accessed Mar. 21, 2007], 5 pages.
RealEstateABC.com, see paragraph headed "How do I make the estimate more accurate?" www.realestateabc.com/home-values/ <http://www.realestateabc.com/home-values/>, Internet Archive Dated: Apr. 5, 2006, [accessed Mar. 20, 2007], 4 pages.
RealQuest.com screen capture, dated at least by Dec. 12, 2002, 1 page.
RealQuest.com screen capture, dated at least by Oct. 20, 2004, 1 page.
RealQuest.com ValuePoint R4 Report screen capture, dated at least by Sep. 30, 2002, 1 page.
RealQuest.com Vector screen capture, dated at least by Oct. 20, 2004, 1 page.
Redfin, https://web.archive.org/web/20060907212454/http :/ /www .redfin.com/stingray/do/terms-ofuse?rt=fn-tl, Wayback Machine Sep. 7, 2006.
Reis SE 2.0 User Guide Book, Reis, 2004, 40 pages.
Reis SE 2.0 User Guide Book, Reis, 2005, 37 pages.
Reis Valuation and Credit Risk Analysis Module Overview, [online], Sep. 18, 2003, Retrieved from the Internet via the Wayback Machine dated Sep. 19, 2003 on Jun. 17, 2013, URL: http://www.reiscom/valuation/valuationOverview.cfm, 2 pages.
Replacement Demonstrative Exhibit for Oral Hearing, U.S. Pat. No. 7,970,674, Case IPR2013-00034, File Date Nov. 21, 2013, 83 pages.
Replacement Patent Owner's Demonstrative Exhibit for Oral Hearing, U.S. Pat. No. 7,970,674, Case IPR2013-00034, File Date Nov. 21, 2013, 36 pages.
Reply Brief for U.S. Appl. No. 11/524,048, dated Dec. 22, 2010, 6 pages.
Request for Rehearing for U.S. Pat. No. 7,970,674, Case No. IPR2013-00034, Apr. 16, 2013, 8 pages.
Requirement Under Rule 105 for U.S. Appl. No. 11/927,623, dated Jul. 2, 2014, 4 pages.
Response to Decision on Appeal for U.S. Appl. No. 11/524,048, Dec. 19, 2012, 7 pages.
Response to Final Office Action for U.S. Appl. No. 11/347,024, dated Mar. 4, 2011, 17 pages.
Revised Petition for Inter Partes Review for U.S. Pat. No. 7,970,674, Case No. IPR2013-00034, Mail Date Nov. 13, 2012, 55 pages.
Rossini, Peter, "Using Expert Systems and Artificial Intelligence for Real Estate Forecasting," Sixth Annual Pacific-Rim Real Estate Society Conference, Sydney, Australia, Jan. 24-27, 2000, 10 pages.
Rye, Owen E., "A Multiple Criteria Analysis Model for Real Estate Evaluation," Journal of Global Optimization 12.2, Mar. 1998, pp. 197-214.
Rye, Owen E., "Automated Property Assessment," Transactions of the American Association of Cost Engineers, Nov. 2004, pp. 28-32.
Sample Appraisal Report of a Single-Family Residence, U.S. Appraisal, Sep. 15, 1982, 16 pages.
Sample HomeSmart Value Report, [online], Retrieved from the Internet via the Wayback Machine dated Dec. 10, 2005 on Jun. 19, 2013, URL: http://homesmartreports.com/samples/samplevaluation.htm, 4 pages.
Sample Residential Appraisal Report, U.S.Appraisal, Jul. 16, 1982, 2 pages.
Second Office Action in Chinese Patent Application No. 200710306194.8, dated Apr. 1, 2010, 9 pages, english translation.
Simons, R. A., "Chapter 6: Valuation of Impaired Property," When Bad Things Happen to Good Property, Throupe, R. et al., Environmental Law Institute, May 2006, 30 pages.
Software Referral Agreement with Sole Source Provision between Sperry Corporation and U.S.Appraisal, May 1985, 47 pages.
Standard & Poors, "Guidelines for the use of Automated Valuation Models for U.K. RMBS Transactions," http://www.rics.org/NR/rdonlyres/8Fcdd20c-7FAC-4549-86FB-3930CD0CBC05/0/StandardandPoorsReportonAVMs.pdf, Published Feb. 20, 2004, 4 pages.
StatSoft, Inc., "Classification Trees," http://www.statsoft.com/textbook/stclatre.html, ã1984-2003 [accessed Dec. 13, 2005], pp. 1-20.
Svetnik et al., "Random Forest: A Classification and Regression Tool for Compound Classification and QSAR Modeling", J Chem Info. Computer Science, vol. 43, 2003, pp. 1947-1958.
System Operations Manual for "The Research Assistant", Evaluation Services, Inc., Feb. 12, 1997, 92 pages.
System Operations Manual, "The Research Assistant", Database Valuation Version, Evaluation Services, Inc., Feb. 12, 1997, 35 pages.
Tay et al., "Artificial Intelligence and the Mass Appraisal of Residential Apartments," Journal of Property Valuation and Investment, Feb. 1, 1992, 17 pages.
The Assessor, A Computerized Assessment System, Ncr Corporation, 1986, 6 pages.
The MicroAppraisal, Certificate of Copyright Registration, Feb. 2, 1984, 2 pages.
Transcript of Deposition of R. A. Borst, Ph. D., Case IPR2013-00034 (JL), Transcribed Sep. 19, 2013, 177 pages.
Transcript of Proceedings in Case No. C 11-06637 RS, Jan. 24, 2013, 24 pages.
U.S. Appraisal Business Plan, dated at least since Aug. 1, 1985, 30 pages.
U.S. Appraisal Offering Memorandum, Sep. 12, 1984, 66 pages.
US. Appraisal Profit and Loss Proforma, dated at least since Aug. 1, 1985, 38 pages.
Valuation Reports, Schedule A, U.S. Appraisal, dated at least by Nov. 1, 1986, 6 pages.
Valuations, Claims Cross Engines, Inman News Features, Dec. 10, 2002, 1 page.
ValuePoint4 Report; File No. 04040103629, Apr. 12, 2004, 3 pages.
Vapnik et al., "Support-Vector Networks," Machine Learning, vol. 20, 1995, 25 pages.
VeroValue screen capture, dated at least by Sep. 30, 2004, 1 page.
Visual PAMSPro 2000, [online], Retrieved from the Internet via the Wayback Machine dated Mar. 4, 2001 on Jun. 19, 2013, URL: http://www.visualpamspro.com/prod01.htm, 2 pages.
Visual PAMSPro Custom Add Ins, [online], Retrieved from the Internet via the Wayback Machine dated Mar. 5, 2001 on Jun. 19, 2013, URL: http://www.visualpamspro.com/serv04.htm, 2 pages.
Visual PAMSPro Downloads, [online], Retrieved from the Internet via the Wayback Machine dated Mar. 2, 2001 on Jun. 19, 2013, URL: http://www.visualpamspro.com/download.htm, 1 page.
Visual PAMSPro Home, [online], Retrieved from the Internet via the Wayback Machine dated Mar. 2, 2001 on Jun. 19, 2013, URL: http://www.visualpamspro.com/, 1 page.
Visual PAMSPro News, [online], Retrieved from the Internet via the Wayback Machine dated Mar. 2, 2001 on Jun. 19, 2013, URL: http://www.visualpamspro.com/news.htm, 2 pages.

(56) References Cited

OTHER PUBLICATIONS

Visual PAMSPro Products, [online], Retrieved from the Internet via the Wayback Machine dated Mar. 2, 2001 on Jun. 19, 2013, URL: http://www.visualpamspro.com/products.htm, 1 page.
Visual PAMSPro Real Estate Appraisal Software, Appraisal Software Real Estate, [online], Retrieved from the Internet via the Wayback Machine dated Sep. 2, 2001 on Jun. 19, 2013, URL: http://www.visualpamspro.com/prodvpp2.htm, 6 pages.
Visual PAMSPro Tips and Tricks, [online], Retrieved from the Internet via the Wayback Machine dated Mar. 2, 2001 on Jun. 19, 2013, URL: http://www.visualpamspro.com/Tips-Tricks.htm, 1 page.
Wikipedia, Expectation-maximization Algorithm, [online] Retrieved from the Internet via the Wayback Machine dated Dec. 21, 2013 on Feb. 28, 2014, URL: http://en.wikipedia.org/wiki/Expectation%E2%80%93maximization_algorithm, 13 pages.
Wikipedia, Survival Analysis, <http://en.wikipedia.org/wiki/Survival_analysis> Oct. 16, 2011, Archived by Internet Wayback Machine <http://web.archive.org/web/20111016061152/http://!en.wikipedia.org/wiki/Survival_analysis>, viewed Aug. 28, 2015, pp. 1-5.
Zillow.com, Quarterly Report 2Q 2006, A Review of the San Francisco Real Estate Market.
U.S. Appl. No. 16/125,318 of Humphries et al., filed Sep. 7, 2018.
U.S. Appl. No. 16/129,282 of Humphries et al., filed Sep. 12, 2018.
Final Office Action for U.S. Appl. No. 14/721,437, dated Nov. 9, 2018, 84 pages.
Final Office Action for U.S. Appl. No. 14/709,719, dated Aug. 3, 2018, 27 pages.
Final Office Action for U.S. Appl. No. 14/640,860, dated Oct. 23, 2018, 85 pages.
Non-Final Office Action for U.S. Appl. No. 12/924,037, dated Nov. 7, 2018, 10 pages.
Non-Final Office Action for U.S. Appl. No. 13/843,577, dated Aug. 30, 2018, 63 pages.
Notice of Allowance for U.S. Appl. No. 13/044,490, dated Dec. 5, 2018, 6 pages.
Readyratios.com, "Cost Approach to Value," https://www.readyratios.com/reference/appraisal/cost_approach_to_value.html, archived on Jul. 16, 2013, https://web.archive.org/web/20130716153950/https:www.readyratios.com/reference/appraisal/cost_approach_tovalue.html, viewed Oct. 30, 2018, p. 1.
Final Office Action for U.S. Appl. No. 13/044,480, dated Dec. 14, 2018, 35 pages.
Non-Final Office Action for U.S. Appl. No. 14/325,094, dated Dec. 18, 2018, 95 pages.
Non-Final Office Action for U.S. Appl. No. 14/846,632, dated Dec. 26, 2018, 13 pages.
U.S. Appl. No. 15/996,787 of VanderMey, filed Jun. 4, 2018.
Archer, W.R. et al., "Measuring the Importance of Location in House Price Appreciation", J. of Urban Economics, vol. 40, 1996, pp. 334-353, accessible at https://www.sciencedirect.com/science/article/pii/S0094119096900364 (accessed Feb. 26, 2018). (Year: 1996).
Campbell, "Forced Sales and House Prices", 101 American Economic Review 2108, pp. 2108-2131, Aug. 2011.
Clauretie, "Estimating the House Foreclosure Discount Corrected for Spatial Price Interdependence and Endogeneity of Marketing Time", 37 Real Estate Economics 43, pp. 44-48, 2009.
Final Office Action for U.S. Appl. No. 14/041,450, dated Jun. 29, 2018, 14 pages.
Final Office Action for U.S. Appl. No. 14/704,567, dated May 1, 2018, 24 pages.
Final Office Action for U.S. Appl. No. 12/924,037, dated Jun. 7, 2018, 19 pages.
Final Office Action for U.S. Appl. No. 14/325,094, dated Jun. 5, 2018, 81 pages.
Final Office Action for U.S. Appl. No. 14/524,148, dated Jul. 19, 2018, 54 pages.
Final Office Action for U.S. Appl. No. 13/828,680, dated Jul. 11, 2018, 59 pages.
Final Office Action for U.S. Appl. No. 14/846,632, dated Jun. 11, 2018, 16 pages.
Gelfand, A.E. et al., "The Dynamics of Location in Home Price," J. of Real Estate Fin. and Econ., vol. 29:2, 2004, pp. 149-166, accessible at https://link.springer.com/content/pdf/10.1023%2FB%3AREAL.0000035308.15346.0a.pdf (accessed Feb. 26, 2018). (Year: 2004).
Humphries, S., "Foreclosure Liquidations Abate in the Fourth Quarter But at the Expense of Number of Homes Underwater," Zillow Research, Feb. 8, 2011, 3 pages.
Non-Final Office Action for U.S. Appl. No. 13/044,480, dated May 2, 2018, 51 pages.
Non-Final Office Action for U.S. Appl. No. 11/927,623, dated Mar. 26, 2018, 15 pages.
Non-Final Office Action for U.S. Appl. No. 14/640,860, dated Mar. 7, 2018, 141 pages.
Non-Final Office Action for U.S. Appl. No. 13/830,497, dated Apr. 12, 2018, 48 pages.
Notice of Allowance for U.S. Appl. No. 13/044,490, dated May 22, 2018, 8 pages.
Notice of Allowance for U.S. Appl. No. 14/167,962, dated Apr. 9, 2018, 11 pages.
Notice of Allowance for U.S. Appl. No. 14/167,962, dated May 14, 2018, 8 pages.
Quercia, R.G. et al., "Spatio-Temporal Measurement of House Price Appreciation in Underserved Areas," J. of Housing Research, vol. 11, 2000, available at https://pdfs.semanticscholar.org/3a44/ddfbc508t61f8952d7e440c37cfdfat441 ba.pdf (accessed Feb. 26, 2018). (Year: 2000).
Roth, JD, "Is it Better to Rent or to Buy?" Time Business, Dec. 3, 2012, 2 pages.
U.S. Appl. No. 15/698,276 of Humphries et al., filed Sep. 7, 2017.
U.S. Appl. No. 15/715,098 of Moghimi, filed Sep. 25, 2017.
U.S. Appl. No. 15/789,617 of VanderMey, filed Oct. 20, 2017.
Beracha, E., et al., "The Rent versus Buy Decision: Investigating the Needed Property Appreciation Rates to be Indifferent between Renting and Buying Property." Journal of Real Estate Practice and Education, 15(2), 71-88.
Final Office Action for U.S. Appl. No. 12/924,037, dated Jul. 19, 2017, 25 pages.
Final Office Action for U.S. Appl. No. 14/078,076, dated Jul. 27, 2017, 32 pages.
Final Office Action for U.S. Appl. No. 14/167,962, dated Nov. 9, 2017, 23 pages.
Final Office Action for U.S. Appl. No. 13/044,480, dated Jun. 12, 2017, 55 pages.
Final Office Action for U.S. Appl. No. 13/830,497, dated Jun. 8, 2017, 57 pages.
Final Office Action for U.S. Appl. No. 13/843,577, dated Oct. 6, 2017, 83 pages.
Final Office Action for U.S. Appl. No. 14/041,450, dated Apr. 6, 2017, 47 pages.
Non-Final Office Action for U.S. Appl. No. 14/041,450, dated Nov. 16, 2017, 11 pages.
Non-Final Office Action for U.S. Appl. No. 14/704,567, dated Dec. 7, 2017, 19 pages.
Non-Final Office Action for U.S. Appl. No. 12/924,037, dated Jan. 10, 2018, 17 pages.
Non-Final Office Action for U.S. Appl. No. 13/044,490, dated Jan. 24, 2018, 8 pages.
Non-Final Office Action for U.S. Appl. No. 13/828,680, dated Nov. 16, 2017, 47 pages.
Non-Final Office Action for U.S. Appl. No. 14/325,094, dated Oct. 31, 2017, 69 pages.
Non-Final Office Action for U.S. Appl. No. 14/524,148, dated Dec. 15, 2017, 27 pages.
Non-Final Office Action for U.S. Appl. No. 14/721,437, dated Dec. 18, 2017, 53 pages.
Non-Final Office Action for U.S. Appl. No. 14/846,632, dated Jan. 16, 2018, 9 pages.
Non-Final Office Action for U.S. Appl. No. 11/927,623, dated Oct. 6, 2017, 15 pages.

(56) References Cited

OTHER PUBLICATIONS

Non-Final Office Action for U.S. Appl. No. 14/167,962, dated Apr. 6, 2017, 22 pages.
Non-Final Office Action for U.S. Appl. No. 14/709,719, dated Jan. 31, 2018, 11 pages.
U.S. Appl. No. 16/235,009 for Humphries, filed Dec. 28, 2018.
Non-Final Office Action for U.S. Appl. No. 14/041,450, dated Jan. 8, 2019, 23 pages.
Final Office Action for U.S. Appl. No. 14/325,094, dated Jun. 7, 2019, 58 pages.
Final Office Action for U.S. Appl. No. 11/927,623, dated Jun. 14, 2019, 18 pages.
Non-Final Office Action for U.S. Appl. No. 14/704,567, dated Apr. 1, 2019, 29 pages.
Non-Final Office Action for U.S. Appl. No. 13/828,680, dated Jul. 1, 2019, 63 pages.
Non-Final Office Action for U.S. Appl. No. 14/709,719, dated Jun. 3, 2019, 29 pages.
Notice of Allowance for U.S. Appl. No. 12/924,037, dated Apr. 24, 2019, 11 pages.
Notice of Allowance for U.S. Appl. No. 13/044,480, dated Jun. 26, 2019, 17 pages.
U.S. Appl. No. 16/449,210 for Flint et al., filed Jun. 21, 2019.
Final Office Action for U.S. Appl. No. 14/041,450, dated Sep. 24, 2019, 22 pages.
Final Office Action for U.S. Appl. No. 14/846,632, dated Aug. 6, 2019, 16 pages.
Non-Final Office Action for U.S. Appl. No. 14/640,860, dated Sep. 6, 2019, 83 pages.
Non-Final Office Action for U.S. Appl. No. 14/721,437, dated Aug. 22, 2019, 84 pages.
Non-Final Office Action for U.S. Appl. No. 15/698,276, dated Oct. 16, 2019, 34 pages.
Notice of Allowance for U.S. Appl. No. 14/704,567, dated Oct. 15, 2019, 17 pages.
Eamer, M., "ZipRealty and Redfin Integrate with Zillow's API," via the Wayback Machine as published on Oct. 23, 2006.
Gudell, Svenja, "One More Advance in Creating a Better Price-to-Rent Ratio", retrieved from the Internet, URL: https://www.zillow.com/research/one-more-advance-in-creating-a-better-price-to-rent-ratio-2968, Jul. 27, 2012, 4 pages.
Kottle, M.L., Zillow traffic up after shift; site known for real estate prices decided to add for-sale listings. San Francisco Chronicle.
Non-Final Office Action for U.S. Appl. No. 11/927,623, dated Nov. 5, 2019, 18 pages.
Non-Final Office Action for U.S. Appl. No. 14/325,094, dated Nov. 4, 2019, 58 pages.
Non-Final Office Action for U.S. Appl. No. 14/524,148, dated Nov. 1, 2019, 44 pages.
U.S. Appl. No. 16/457,390 for Shahbazi et al., filed Jun. 28, 2019.
U.S. Appl. No. 16/665,426 for Humphries et al., filed Oct. 28, 2019.
Final Office Action for U.S. Appl. No. 15/698,276, dated Apr. 9, 2020, Examiner C.E. Zelaskiewicz, 32 pages.
Final Office Action for U.S. Appl. No. 13/828,680, dated Jan. 3, 2020, Examiner E.L. Pratt, 60 pages.
Final Office Action for U.S. Appl. No. 14/325,094, date Apr. 22, 2020, Examiner G. Araque, Jr., 53 pages.
Final Office Action for U.S. Appl. No. 14/524,148, dated Mar. 9, 2020, Examiner J.H. Austin, 62 pages.
Final Office Action for U.S. Appl. No. 14/640,860, dated Apr. 14, 2020, Examiner P. McAtee, 85 pages.
Final Office Action for U.S. Appl. No. 14/709,719, dated Dec. 2, 2019, Examiner A.K. Robinson, 35 pages.
Final Office Action for U.S. Appl. No. 14/721,437, dated Apr. 16, 2020, Examiner M.C. Young, 103 pages.
Mikhed, V., et al., "Testing for Bubbles in Housing Markets: A Panel Data Approach," the Journal of Real Estate Finance and Economics, vol. 38, 2007, pp. 366-386.
Nazerzadeh, H., "Internet Advertising: Optimization and Economic Aspects," Stanford University, 2009, 6 pages.
Non-Final Office Action for U.S. Appl. No. 14/846,632, dated Nov. 29, 2019, Examiner K.S. Campen, 24 pages.
Non-Final Office Action for U.S. Appl. No. 15/789,617, dated Mar. 26, 2020, Examiner W.B. Bunker, 37 pages.
Non-Final Office Action for U.S. Appl. No. 16/125,318, dated Mar. 13, 2020, Examiner H. Tran, 20 pages.
Non-Final Office Action for U.S. Appl. No. 16/235,009, dated Jan. 24, 2020, Examiner K. Gills, 18 pages.
Notice of Allowance for U.S. Appl. No. 14/704,567, dated Jun. 25, 2020, Examiner M.L. Hamilton, 17 pages.
Notice of Allowance for U.S. Appl. No. 14/078,076, dated Apr. 10, 2020, Examiner T.H. Dang, 9 pages.
Remodeling Magazine, Remodeling Cost vs Value Report 2006, Hanley Wood LLC, pp. 1-6.
Turner, J., "Ad Slotting and Pricing: New Media Planning Models for New Media," Carnegie Mellon University, Apr. 23, 2010, 132 pages.
Chen, T. et al., "XGBoost: Reliable Large-scale Tree Boosting System," University of Washington, 2015, 6 pages.

* cited by examiner

ENFORCING, WITH RESPECT TO CHANGES IN ONE OR MORE DISTINGUISHED INDEPENDENT VARIABLE VALUES, MONOTONICITY IN THE PREDICTIONS PRODUCED BY A STATISTICAL MODEL

CROSS-REFERENCE TO RELATED APPLICATION(S)

This application claims the benefit of US Provisional Application No. 62/300,054 filed on Feb. 25, 2016, which is hereby incorporated by reference in its entirety. In cases where this application and the application incorporated by reference conflict, this application controls.

TECHNICAL FIELD

This patent application is directed to the field of machine learning.

BACKGROUND

Statistical models are a machine learning mechanism for predicting for a system the value of a dependent variable based upon the values of related independent variables. Typically a model is trained to do so for a particular domain using "observations," each a combination of a set of independent variable values that occur in the system with a particular value of the dependent variable. Training the model based upon these observations involves defining the model in such a way that it predicts, for the set of independent variable values of each observation, a value of the dependent variable that is similar to the dependent variable value of the observation. Once trained, a model can be applied to a particular set of independent variable values to predict what dependent variable value will occur in the system for this set of independent variable values.

A variety of types of statistical models are used in this way, including linear regression models and random forest models. A linear regression model is a mathematical expression in which a constant coefficient is established for each independent variable, along with a single constant intercept value. These constant values defining the linear regression model are established in a way that fits the linear regression model to the training observations. To apply the trained linear regression model to a particular set of independent variable values, each independent variable value of the set is multiplied by the corresponding coefficient, and these products are summed, along with the intercept value.

A random forest model constitutes a collection of partitioning decision trees. These decision trees are typically binary trees, each of which can be traversed from its root to a leaf based upon a set of independent variable values for which a dependent variable value is to be predicted. In particular, each non-leaf node represents a partitioning of the range of possible values for an independent variable. Traversal to a leaf involves, at each non-leaf node beginning with root node, following the edge assigned the part of the range of possible values for the corresponding independent variable in which the value of the independent variable of the set of independent variable values falls. Each node of the tree is assigned a value constituting an aggregation—such as the mean—of the dependent variable values of the training observations whose independent variable values result in the traversal from the root to the node. Applying a random forest model to a set of independent variable values for which a dependent variable value is to be predicted constitutes traversing each tree of the forest from the root to a leaf based upon those independent variable values, then aggregating the values of the traversed-to leaf of each tree, such as by determining the mean of these values.

As part of training a random forest model, each tree of the random forest is typically constructed by randomly selecting a proper subset of the available observations. To create each node of the tree, beginning with root node, a partitioning of the possible range of values for a particular independent variable is determined that, among the observations represented by the node, divide these observations into two groups each of whose dependent variable values are the smallest total distance from the group's aggregated dependent variable value.

Often, after applying a trained model to predict a dependent variable value for a set of independent variable values, a user can vary one or more of the independent variable values of the set, and apply the model to the modified set of independent variable values to predict a new dependent variable value.

DETAILED DESCRIPTION

Figure 1:
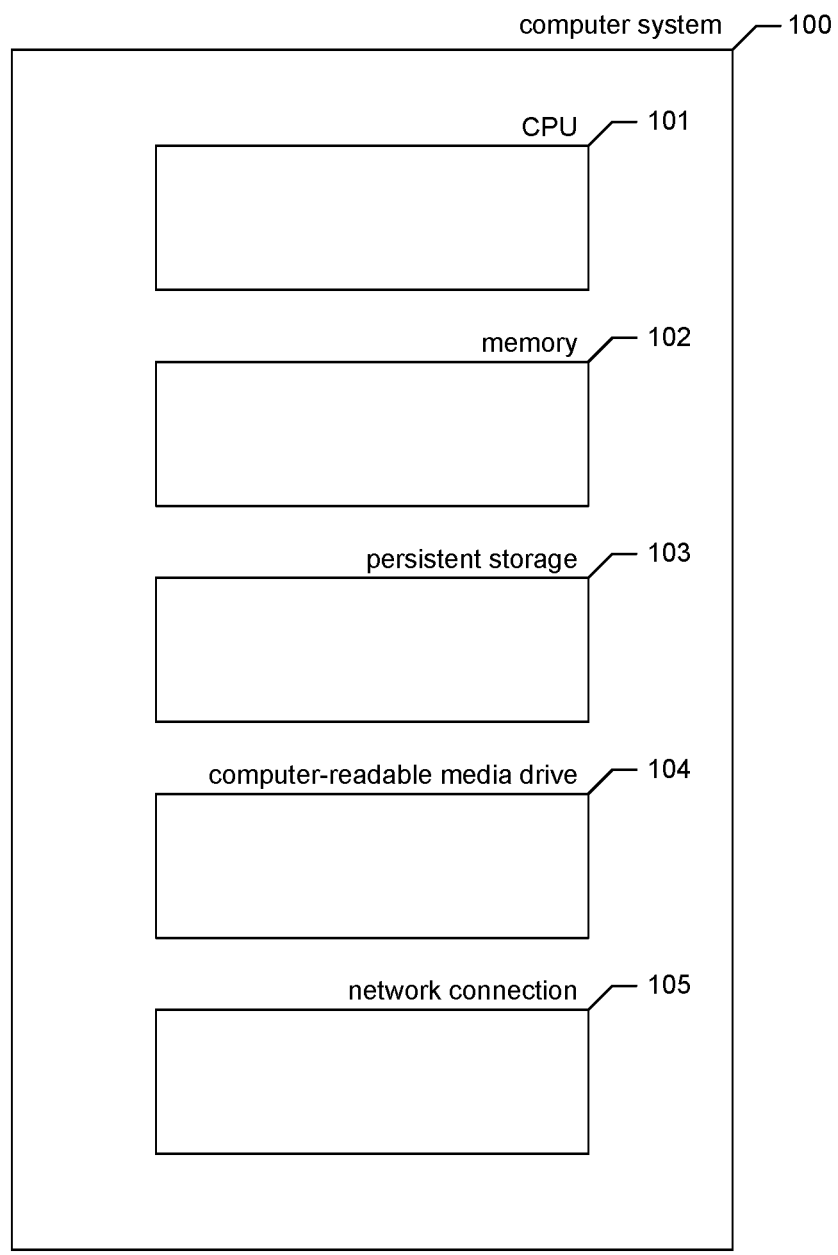
FIG. 1 is a block diagram showing some of the components typically incorporated in at least some of the computer systems and other devices on which the facility operates

The inventors have recognized significant disadvantages of conventional techniques that use statistical models to predict values of dependent variables. In particular, a user may (1) apply a trained model to predict the dependent variable value for a set of independent variable values, (2) alter one or more independent variable values in a way that the user expects to move the dependent variable value in a particular direction, (3) then apply the trained model to predict the dependent variable value for the changed independent variable values, and feel surprised that discovering that the dependent variable value has moved in the direction opposite the expected direction.

The inventors have noted that this result can have two different causes: (a) where the model is inaccurate over small changes in independent variable values, or (b) where the model is accurate in a way that is counterintuitive.

In response, the inventors have conceived and reduced to practice a software and/or hardware facility for enforcing, with respect to changes in one or more distinguished independent variable values, monotonicity in the predictions produced by a statistical model ("the facility"). In some cases, the set of independent variable values that changes is sometimes referred to herein as an "occurrence." One or more independent variable values of an occurrence may change, for example, because the initial values of these independent variables are discovered to be incorrect for the occurrence, or because a user wishes to determine the effect on dependent variable value of possible future changes to these independent variable values for the occurrence.

In some embodiments, the facility uses a delta model approach as follows: First, the facility applies a substantive model within which monotonicity is not enforced to predict the dependent variable value for a first set of independent variable values. When a prediction is subsequently sought based upon a modified version of the first set of independent variable values, rather than applying the substantive model to the modified set of values, the facility applies a delta model to the modified values to determine a delta multiplier, and returns a value of the dependent variable obtained by multiplying the earlier -predicted dependent variable value by the determined delta multiplier. In some embodiments, the facility establishes a pipeline of delta models that progresses from a complex delta model to a simple delta model, and uses the most complex delta model that succeeds for the modified set of values.

In some embodiments, the facility uses an innate monotonicity approach, in which it constructs a substantive model that internally enforces monotonicity with respect to the distinguished independent variables. For example, where the substantive model is a model that employs decision trees—such as a random forest model—as part of constructing these decision trees, when choosing for a node of the tree a range partition for a distinguished independent variable, the facility chooses only a range partitions that result in the predicted value of the dependent variable for the left child being less than the predicted value of the dependent variable for the right child. That is, among the observations being used to construct the tree, the observations that traverse the left edge from the node have a lower aggregate value than the observations that traverse the right edge from the node.

By operating in some or all of the ways described above, the facility can overcome localized forms of inaccuracy inherent in many conventional statistical models, and can provide a prediction result that is more likely to be regarded as accurate than a conventional statistical model.

FIG. 1 is a block diagram showing some of the components typically incorporated in at least some of the computer systems and other devices on which the facility operates. In various embodiments, these computer systems and other devices 100 can include server computer systems, desktop computer systems, laptop computer systems, netbooks, mobile phones, personal digital assistants, televisions, cameras, automobile computers, electronic media players, etc. In various embodiments, the computer systems and devices include zero or more of each of the following: a central processing unit ("CPU") 101 for executing computer programs; a computer memory 102 for storing programs and data while they are being used, including the facility and associated data, an operating system including a kernel, and device drivers; a persistent storage device 103, such as a hard drive or flash drive for persistently storing programs and data; a computer-readable media drive 104, such as a floppy, CD-ROM, or DVD drive, for reading programs and data stored on a computer-readable medium; and a network connection 105 for connecting the computer system to other computer systems to send and/or receive data, such as via the Internet or another network and its networking hardware, such as switches, routers, repeaters, electrical cables and optical fibers, light emitters and receivers, radio transmitters and receivers, and the like. While computer systems configured as described above are typically used to support the operation of the facility, those skilled in the art will appreciate that the facility may be implemented using devices of various types and configurations, and having various components.

Figure 2:
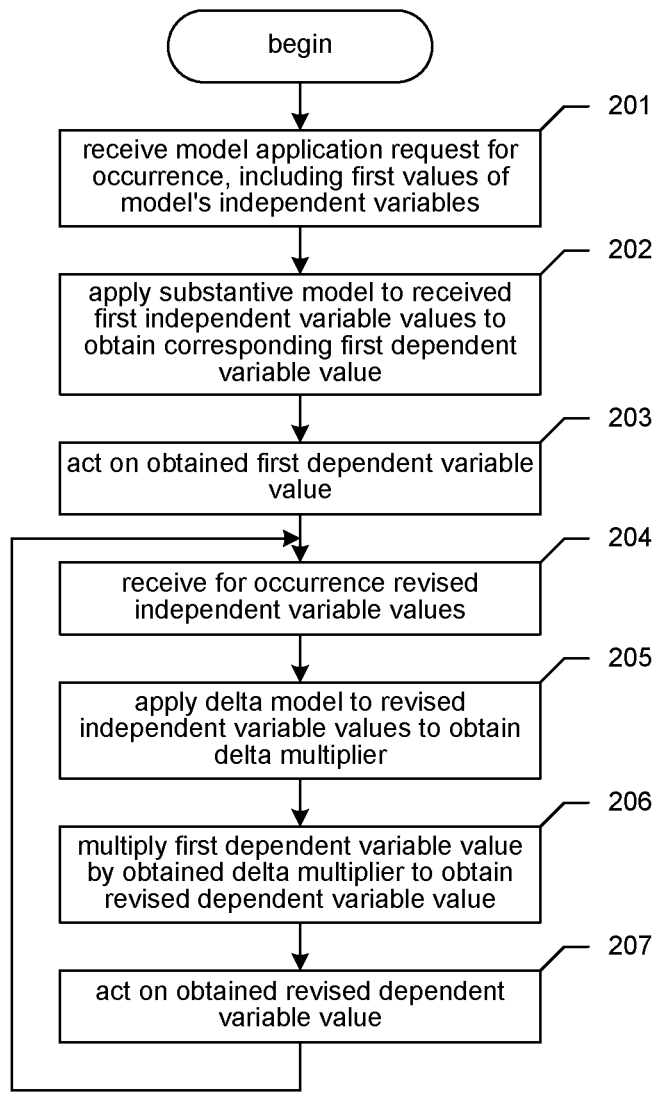
FIG. 2 is a flow diagram showing a process performed by the facility in some embodiments to enforce monotonicity using the delta model approach.

FIG. 2 is a flow diagram showing a process performed by the facility in some embodiments to enforce monotonicity using the delta model approach. Examples of the performance of this method with respect to particular modeling domains are further discussed below. In act 201, the facility receives a request to apply the model to a particular occurrence to obtain for the occurrence a value of the model's dependent variable. The received request includes a first set of values of the model's independent variables. In act 202, the facility applies the substantive model to the first set of independent variable values received in act 201 in order to obtain a corresponding first value of the dependent variable. In act 203, the facility acts on the first value of the dependent variable obtained in act 202. In act 204, the facility receives for the same occurrence a set of independent variable values in which the value of at least one independent variable is changed with respect to the immediately preceding set of independent variable values received in act 201 or 204. In act 205, the facility applies a delta model to the revised independent variable values most recently received in act 204 to obtain a delta multiplier. In act 206, the facility multiplies the dependent variable value by the delta multiplier obtained in act 205 in order to obtain a revised dependent variable value. In act 207, the facility acts on the obtained revised dependent variable value. After act 207, the facility continues in act 204 to receive the next set of revised independent variable values for the occurrence.

Those skilled in the art will appreciate that the acts shown in FIG. 2 and in each of the flow diagrams discussed below may be altered in a variety of ways. For example, the order of the acts may be rearranged; some acts may be performed in parallel; shown acts may be omitted, or other acts may be included; a shown act may be divided into sub-acts, or multiple shown acts may be combined into a single act, etc.

Figure 3:
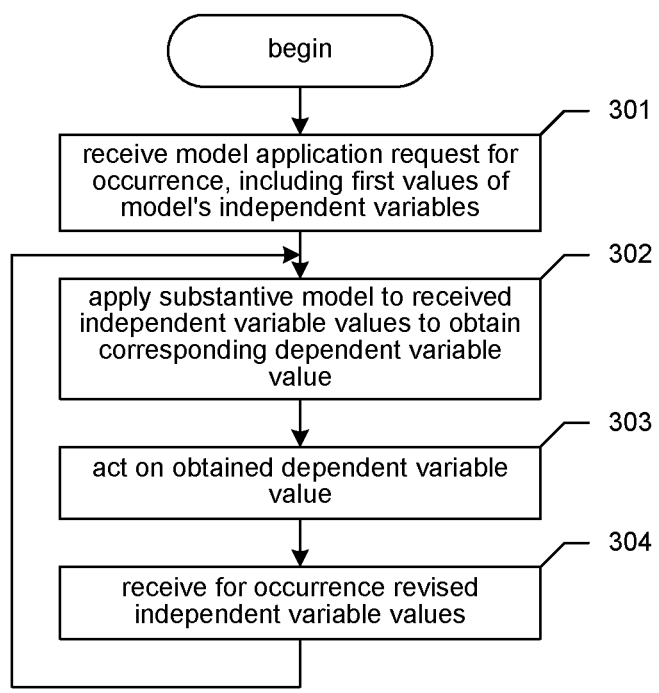
FIG. 3 is a flow diagram showing a process performed by the facility in some embodiments to enforce monotonicity using the innate monotonicity approach.

FIG. 3 is a flow diagram showing a process performed by the facility in some embodiments to enforce monotonicity using the innate monotonicity approach. In act 301, the facility receives a request to apply the model to a particular occurrence to obtain for the occurrence a value of the model's dependent variable. The received request includes a set of values of the model's independent variables. In act 302, the facility applies the substantive model to the set of independent variable values most recently received in act 301 in order to obtain a corresponding value of the dependent variable. The facility relies on aspects of the substantive model to enforce monotonicity of the dependent variable with respect to the distinguished independent variable or variables. In act 303, the facility acts on the value of the dependent variable most recently obtained in act 302. In act 304, the facility receives for the same occurrence a set of independent variable values in which the value of at least one independent variable is changed with respect to the immediately preceding set of independent variable values received in act 301 or 304. After act 304, the facility continues in act 302 to apply the substantive model to the revised independent variable values received in act 304.

Figure 4:
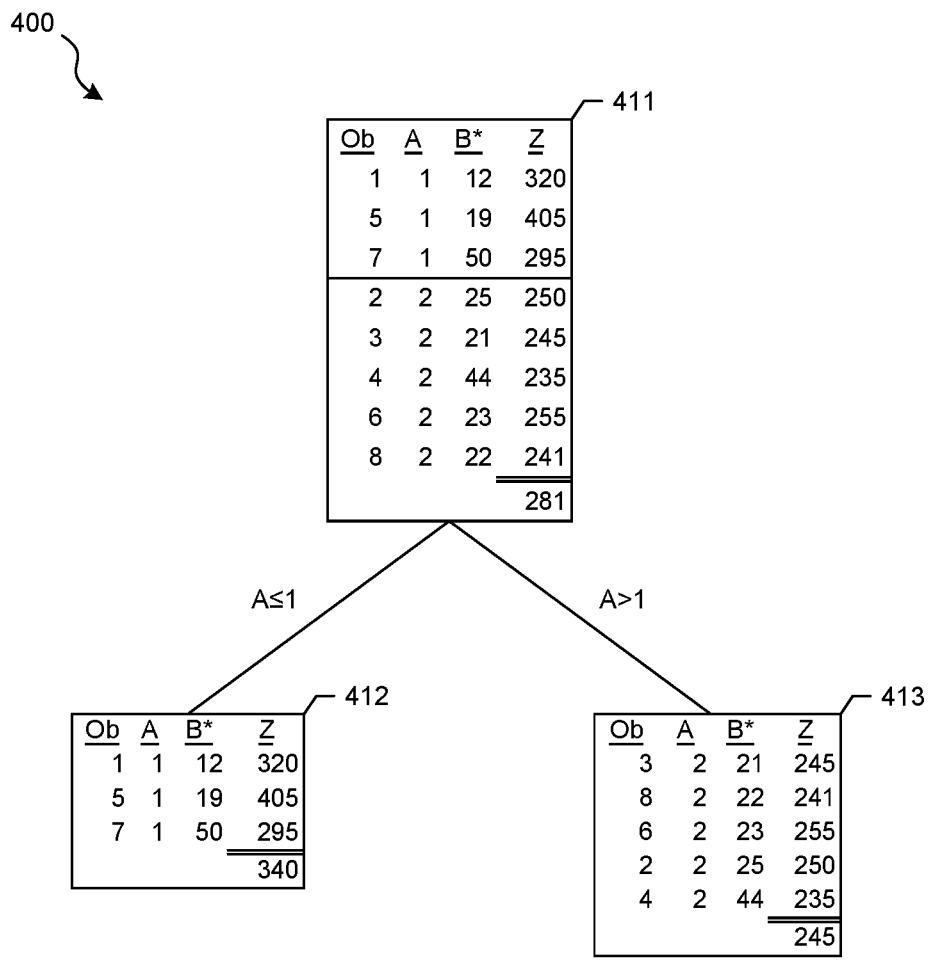
FIG. 4 is a data structure diagram showing a first point in the facility's construction, for the innate monotonicity approach, of a classification tree data structure that makes up part of a random forest model.

FIG. 4 is a data structure diagram showing a first point in the facility's construction, for the innate monotonicity approach, of a classification tree data structure that makes up part of a random forest model. At this point, the tree 400 is made up of a root note 411 having child nodes 412 and 413. The tree is constructed using eight training observations each specifying values of at least two independent variables, A and B*. The asterisk of independent variable B* indicates that it is a distinguished independent variable for which monotonicity is enforced by the facility. The observations also each specify a value of the dependent variable, Z. It can be seen that the root node 411 represents all 8 of these training observations. It can also be seen that the root node has a value of 281, obtained by aggregating the dependent variable values of all 8 of the training observations represented by the root note using the mean aggregation function.

Left child 412 is connected to root node 411 by an "A≤1" edge, while right child 413 is connected to root node 411 by an "A>1" edge. That is, the 8 observations represented by the root node are split into those in which the value of independent variable A is less than or equal to one, and those in which the value of independent variable A is greater than one. It can be seen that former three observations (observations 1, 5, and 7) are represented by left child 412, while the latter five observations (observations 2, 3, 4, 6, and 8) are represented by right child 413. Child node 412 has the value 340—the mean of the dependent variable values of the 3 observations that it represents, while child node 413 has the value 245—the mean of the dependent variable values of the 5 observations that node 413 represents.

One should note that, because the root node was split on values of an independent variable that is not distinguished and for which monotonicity is not enforced, the facility was permitted to establish a split—embodied by child nodes 412 and 413—in which the value of the left child (node 412), 340, is greater than the value of the right child (node 413), 245.

Figure 5:
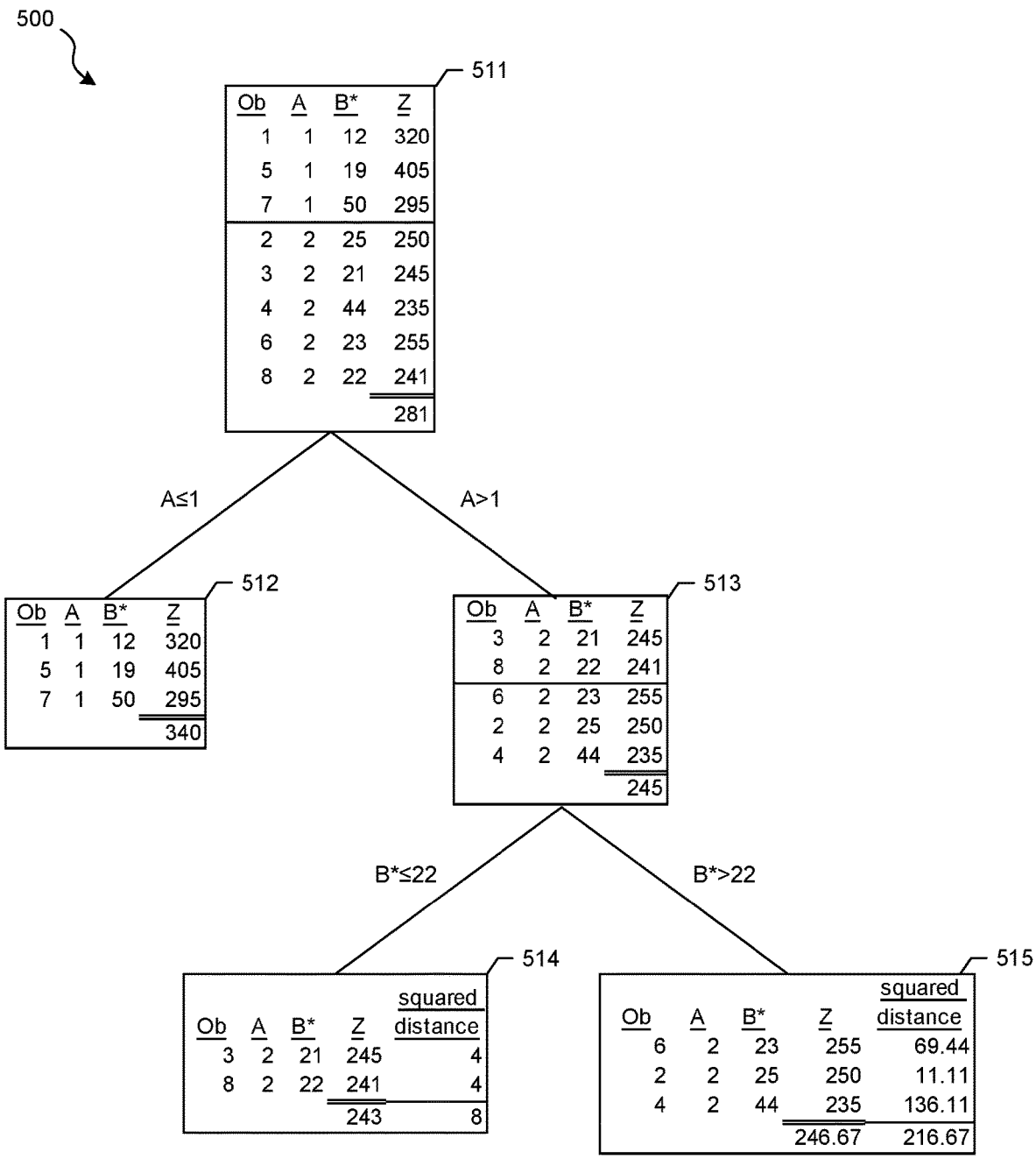
FIG. 5 is a data structure diagram showing a second point in the facility's construction, for the innate monotonicity approach, of a classification tree data shown in FIG. 4.

FIG. 5 is a data structure diagram showing a second point in the facility's construction, for the innate monotonicity approach, of a classification tree data shown in FIG. 4. In particular, FIG. 5 illustrates the facility's enforcement of monotonicity for a distinguished independent variable by declining to split on a distinguished independent variable at a point that creates a left child whose value is greater than that of its right sibling.

At this point, in addition to nodes 511-513 which appear in FIG. 5, the tree 500 also includes nodes 514 and 515, both children of node 513 and representing a split of node 513. Left child 514 is connected to its parent 513 by a "B*≤22" edge, while right child node 515 is connected to its parent 513 by a "B*>22" edge. By examining node 513, whose five represented observations are shown sorted in increasing order of their values of independent variable B*, it can be seen that there are four possible ways to split node 513 on independent variable B*, the second of which is shown in FIG. 5: (1) between the values 21 and 22 of that independent variable, (2) between the values 22 and 23, (3) between the values 23 and 25, and (4) between the values 25 and 44.

In the first possible split, the value of the left child, 245, would not be greater than the value of the right child, 245.5. In the second possible split, the value of the left child, 243, would similarly not be greater than the value of the right child, 246.67. In each of the third and fourth possible splits, however, the value of the left child would be greater than the right child: 247 vs. 242.5, and 247.75 vs. 235, respectively. For this reason, because B* is a distinguished independent variable, the facility is prevented from pursuing the third and fourth possible splits. Among the first and second possible splits, the facility selects the possible split that produces the smallest overall sum of squared distances between each child's value and the dependent variable values of the observations it represents. The second possible split produces an overall sum of squared distances of 220.67 (that is, $(245-243)^2+(241-243)^2+(255-246.67)^2+(250-246.67)^2+(235-246.67)^2$), which is smaller than the overall sum of squared distances produced by the first possible split, 240.75. Accordingly, the facility selects the second possible split, as shown in FIG. 5. This is despite the fact that both the third and fourth possible splits would produce lower overall sums of squared distances than the second possible split—212.5 and 103.19, respectively.

As a result of selecting the second possible split of node 513, the facility ensures that, if an occurrence to which the model containing tree 500 is being applied is for example adjusted from having a value of B* of 22 to a value of B* of 23, the value produced for the occurrence would increase, from 243 to 246.67, and would not decrease. Indeed, there are no increases in B* from one value of B* to any higher value of B* that cause the value produced by the tree for the occurrence to decrease.

The construction of a sample tree shown in FIGS. 4 and 5 relates to an example in which the facility enforces positive monotonicity of the value of the dependent variable with respect to values of the distinguished independent variable B*, in which the value of the dependent variable is prevented from moving in a different direction than the value of the distinguished independent variable. In some embodiments, the facility similarly enforces negative monotonicity of the value of the dependent variable with respect to values of a distinguished independent variable, in which the value of the dependent variable is prevented from moving in the same direction as the value of the distinguished independent variable (not shown). In some embodiments, the facility simultaneously enforces positive monotonicity for one independent variable, and negative monotonicity for another.

Modeling Domains

Those skilled in the art will appreciate that the facility is adaptable to a wide variety of modeling domains. An incomplete list follows.

estimating the merit of performing computing, storage, content delivery, etc. activities on each of a number of available cloud platforms;

Here, each available cloud platform is an occurrence. In various embodiments, a merit score for each occurrence is based upon predictions of one or more of cost, response time, level of reliability, level of security, error rate, etc. In some embodiments, the facility acts on estimation results, such as by causing particular activities to each be performed on the cloud platform for which the highest merit score is estimated.

estimating the merit of using each of a number of available wireless networks for communicating between a first device and one or more second devices;

Here, each wireless network is a different occurrence. In various embodiments, a merit score for each occurrence is based upon predictions of one or more of cost, throughput level, latency level, level of reliability, level of security, error rate, etc. In some embodiments, the facility acts on estimation results, such as by causing a first device to communicate with one or more second devices using the network for which the highest merit score is estimated.

estimating a valuation of an asset, such as a home;

Here, each home is a different occurrence. In various embodiments, a variety of home attributes are considered as independent variables, including interior floor area ("square feet," or "Sqft"), lot size ("LotSize"), number of bathrooms ("#Bathrooms"), number of bedrooms ("#Bedrooms"), number of floors ("Stories"), type of home ("Usecode"), time since construction ("Age"), heating system type, cooling system type, roof type, architectural style, number of covered and uncovered parking spaces, etc. In some embodiments, the facility acts on estimation results, such as by displaying the estimated valuation for a home on a home detail page containing a variety of information about the home; including homes in a search result produced for a search for homes whose valuations fall into a particular range; determining a price at which to list a home for sale; determining a housing price index for a geographic area containing homes whose valuation is estimated; etc.

In some embodiments, in the home valuation modeling domain, the only distinguished independent variable for which the facility enforces same-direction monotonicity is interior floor area. In various embodiments, in the home valuation modeling domain, the facility enforces same-direction monotonicity for one or more distinguished independent variables among interior floor area, lot size, and number of bathrooms.

estimating the merit of following each of a number of different vehicular routes from a current location to a destination;

Here, each route is a different occurrence. In various embodiments, a merit score for each occurrence is based upon predictions of one or more of travel time; travel time certainty; costs such as energy costs, tolls, usage fees, etc.; mode of driving; availability of technological resources such as wireless communication resources, electrical charging facilities, resources that assist automatic or semiautomatic driving; availability of human amenities such as rest areas, restaurants, hotels, etc.; level of safety; level of driving difficulty; etc. In some embodiments, the facility acts on estimation results, such as by causing a vehicle to select the route for which the highest merit score is estimated.

Sample Delta Models

An illustrative example of delta models used by the facility in some embodiments in the home valuation modeling domain are described below.

In some embodiments, the facility uses a progression of delta models that have monotonic constraints on the coefficients for finished square feet (Sqft), lot size (LotSize), and bathroom count (#Bathrooms). Some of these delta models employ shape-constrained cubic basis splines (denoted as "ns" functions). These spline functions break up the input variable into pieces through which the facility fits a cubic polynomial that is constrained to have non-decreasing shape. The ends of each polynomial are also constrained so that they have the same value and are smooth at the transition point (i.e., the transition point has a second derivative of zero). These spline transformations are spline functions, as the spline breaks up the independent variable into sections (basis) based upon the local shape vs. the dependent variables. Thus, when the ns(x,y) function is used, price is the second argument, as that is implicitly the variable against which the interpolation is being evaluated.

In some embodiments, the facility fits unconstrained additional spline models, such as where spline expansion is used by the facility.

In a linear regression, the facility fits one slope for the entire range of an independent variable. With a spline, the facility selects a set of "knots" to break the data up into local ranges, each of which the facility fits with a local function. In the case of linear splines, the local function is a line segment; in the case of polynomial or natural splines, each local function is a smooth curve. The inventors regard natural splines as a good modeling choice because they produce smooth curves while limiting the squiggles that higher-order polynomial functions tend to produce.

The delta models outlined below include a set of smoothed features in which the facility takes the average value of the 50 nearest neighbors of a given property as the value of the independent variable; "SqftSmooth50" is the average value of the finished square feet of the fifty nearest geographic neighbors to a given property based upon latitude and longitude. Also, use code ("Usecode") is a categorical independent variable that tracks the structure type, e.g., townhome vs. condominium vs. detached single family vs. duplex.

In some embodiments, the facility creates nine delta models for each distinct geographic region modeled by the facility. The delta models are ordered from most complex (delta model #1) to least complex (delta model #9), with the complexity being decreased between delta models by removing variables, functions of variables, and interaction terms. The full delta model (#1) is a highly non-linear model and, in cases where transaction data is thin, sometimes fails to produce a viable model that can meet all the constraints placed on the spline functions. In those cases, the facility proceeds to the next most complex model to see if it meets constraints, and can continue up to the ninth model which is a fully linear model and is very likely to meet constraints.

In some embodiments, the facility tests each delta model's ability to satisfy constraints by checking the predictions these models make along a grid of possible values for the distinguished independent variables. For example, for a LotSize distinguished independent variable, the facility checks the predicted values along all lot sizes in a grid, such as from 0 to 5 acres. In some embodiments, the facility handles FinishedSquareFeet and bathroom count distinguished independent variables in a similar way. The facility also checks predictions along the surface of a 2-d grid such as size vs square feet to make sure that all points along the surface formed by predictions in this grid are also monotonically increasing with the respective independent variables.

In some embodiments, the facility computes a "minimum response" table of allowable delta adjustments for the chosen model. This table maps percentage changes in the distinguished independent variables—such as for lot size—to an allowable range of delta adjustments. For example, where lot size increases by 10%, allowable delta adjustments are [1, 1.09]—that is, from no change in value to +9%. The facility generates the cutoffs in this table by looking at the predictions the selection model makes at given percentage changes and setting the lower bound at or near the $25^{th}$ and $75^{th}$ percentiles of delta values produced for a given change in a distinguished independent variable. This all works to limit extreme delta adjustments from being produced by the models.

In the descriptions of the nine delta models that follow, notation is employed as follows:

Parentheses denote functions of the data; e.g., log(#Bathrooms) means that the facility takes the logarithm of the data before entering it into the model for estimation.

Asterisks stand for interaction terms. So, in the case of height and weight: $\beta height*weight = \beta_1 height + \beta_2 weight + \beta_3 height \times weight$. In the preceding example, the facility estimates coefficients for all three terms, whereas a formula of height+weight alone has just a coefficient for each of height and weight separately and not for the term where they are multiplied (interacted).

Spline functions: ns(x,y) stands for constrained spline functions, whereas s(x,y) are unconstrained. Building age is a good example of a variable suited to an unconstrained spline function, as the value of a home often falls off from high new-construction values then rises later at ages corresponding to "classic" homes or homes with historical value.

1: Full model:
$\Delta=\beta_0+\beta_1 ns(\log(Sqft), price)+\beta_2 ns(\log(Lotsize), price)+\beta_3 ZestPerSqftSmooth50* \log(Sqft)+\beta_3 SqftSmooth50*\log(Sqft)+\beta_5 LotsizeSmooth50* \log(LotSize)+\beta_6 ns(\#Bathrooms, price)*\log(Sqft)+\beta_7\log(\#Bedrooms)+\beta_8 s(\log(Age), price)*\log(Sqft)+\beta_9\#Stories+\beta_{10}Usecode$ 2: Like the full model but without the interaction term on #Bathrooms with square footage.
$\Delta=\beta_0+\beta_1 ns(\log(Sqft), price)+\beta_2 ns(\log(Lotsize), price)+\beta_3 ZestPerSqftSmooth50* \log(Sqft)+\beta_3 SqftSmooth50*\log(Sqft)+\beta_5 LotsizeSmooth50* \log(LotSize)+\beta_6 ns(\#Bathrooms, price)+\beta_7\log(\#Bedrooms)+\beta_8 s(\log(Age), price)*\log(Sqft)+\beta_9\#Stories+\beta_{10}Usecode$ 3: Like the second model but drops the smoothed lot size interaction with lot size
$\Delta=\beta_0+\beta_1 ns(\log(Sqft), price)+\beta_2 ns(\log(Lotsize), price)+\beta_3 ZestPerSqftSmooth50* \log(Sqft)+\beta_3 SqftSmooth50*\log(Sqft)+\beta_5 LotsizeSmooth50+\beta_6 ns(\#Bathrooms, price)+\beta_7\log(\#Bedrooms)+\beta_8 s(\log(Age), price)* \log(Sqft)+\beta_9\#Stories+\beta_{10}Usecode$ 4: Like the third model but removes the interaction between bathrooms and square feet:
$\Delta=\beta_0+\beta_1 ns(\log(Sqft), price)+\beta_2 ns(\log(Lotsize), price)+\beta_3 zestPerSqftSmooth50* \log(Sqft)+\beta_3 SqftSmooth50*\log(Sqft)+\beta_5 LotsizeSmooth50+\beta_6\#Bathrooms+\beta_7\log(\#Bedrooms)+\beta_8 s(\log(Age), price)*\log(Sqft)+\beta_9\#Stories+\beta_{10}Usecode$ 5: Same as model four but drops Usecode from the model:
$\Delta=\beta_0+\beta_1 ns(\log(Sqft), price)+\beta_2 ns(\log(Lotsize), price)+\beta_3 ZestPerSqftSmooth50* \log(Sqft)+\beta_3 SqftSmooth50*\log(Sqft)+\beta_5 LotsizeSmooth50+\beta_6\#Bathrooms+\beta_7\log(\#Bedrooms)+\beta_8 s(\log(Age), price)*\log(Sqft) +\beta_9\#Stories$ 6: Like model five but removes spline function on lot size:
$\Delta=\beta_0+\beta_1 ns(\log(Sqft), price)+\beta_2\log(Lotsize)+\beta_3 ZestPerSqftSmooth50*\log(Sqft) +\beta_3 SqftSmooth50*\log(Sqft)+\beta_5 LotsizeSmooth50+\beta_6\#Bathrooms +\beta_7\log(\#Bedrooms)+\beta_8 *s(\log(Age), price)*\log(Sqft)+\beta_9\#Stories$ 7: Like model six but removes all interaction terms involving lot size:
$\Delta=\beta_0+\beta_1 sp(\log(Sqft), price)+\beta_2\log(Lotsize)+\beta_3 ZestPerSqftSmooth50*\log(Sqft) +\beta_3 SqftSmooth50+\beta_5 LotsizeSmooth50+\beta_6\#Bathrooms +\beta_7\log(\#Bedrooms)+\beta_8 s(\log(Age), price)*\log(Sqft)+\beta_9\#Stories$ 8: Like model seven but removes square feet interactions to create a no interactions model:
$\Delta=\beta_0+\beta_1 sp(\log(Sqft), price)+\beta_2\log(Lotsize)+\beta_3 ZestPerSqftSmooth50+\beta_3 SqftSmooth50+\beta_5 LotsizeSmooth50+\beta_6\#Bathrooms +\beta_7\log(\#Bedrooms)+\beta_8 s(\log(Age), price)+\beta_9\#Stories$ 9: Like model eight but removes the spline function on square footage to make a model that is linear in all home characteristics but age.
$\Delta=\beta_0+\beta_1\log(Sqft)+\beta_2\log(Lotsize)+\beta_3 ZestPerSqftSmooth50+\beta_3 SqftSmooth50+\beta_5 LotsizeSmooth50+\beta_6\#Bathrooms+\beta_7\log(\#Bedrooms) +\beta_8 s(\log(Age), price)+\beta_9\#Stories$ It will be appreciated by those skilled in the art that the above-described facility may be straightforwardly adapted or extended in various ways. While the foregoing description makes reference to particular embodiments, the scope of the invention is defined solely by the claims that follow and the elements recited therein.

We claim:

1. A method in a computing system for estimating a value relating to an occurrence, comprising:

constructing a first machine learning statistical model, wherein the first machine learning statistical model comprises a constant coefficient for each of a plurality of independent variables and a single constant intercept value;

constructing a second machine learning statistical model, wherein the second machine learning statistical model comprises a collection of partitioning decision trees, wherein each partitioning decision tree can be traversed from its root to a leaf based upon a set of independent variable values and wherein each non-leaf node of the partitioning decision trees represents a partitioning of a range of possible values for an independent variable, wherein constructing the second machine learning statistical model comprises:

randomly selecting a proper subset of available observations, and dividing the randomly selected observations into two groups, each of whose dependent variable values are a smallest total distance from an aggregated dependent variable value, wherein choosing range partitions for nodes of at least one partitioning decision tree comprises choosing only range partitions that result in predicted values of a dependent value for a left child being less than a predicted value of the dependent value for a right child so that, among observations being used to construct the at least one partitioning decision tree, observations that traverse a left edge of the at least one partitioning tree from a distinguished node have a lower aggregate value than observations that traverse a right edge of the at least one partitioning tree from the distinguished node;

receiving a first occurrence specifying a first value for each of multiple independent variables of the plurality of independent variables;

subjecting the first independent variable values specified by the received first occurrence to the second machine learning statistical model to obtain a first value of the dependent variable;

receiving a second occurrence specifying a second value for each of the multiple independent variables of the plurality of independent variables, the second value of the distinguished independent variable varying from the first value of the distinguished independent variable in a first direction; and subjecting the second independent variable values specified by the received second occurrence to the second machine learning statistical model to obtain a second value of the dependent variable, the second value of the dependent variable guaranteed not to vary from the first value of the dependent variable in a second direction that is opposite the first direction.

2. The method of claim 1, further comprising:
acting on the obtained first value of the dependent variable.

3. The method of claim 1 wherein the second machine learning statistical model, when it is subjected to the second independent variable values, uses the obtained first value of the dependent variable in obtaining the second value of the dependent variable.

4. The method of claim 1 wherein the second machine learning statistical model comprises a substantive model that determines the first value of the dependent variable based on the first value of the distinguished independent variable, and a delta model that determines the second value of the dependent variable based upon the first and second values of the distinguished independent variable and the first value of the dependent variable.

5. The method of claim 1 wherein the first machine learning statistical model comprises a model that both determines the first value of the dependent variable based on the first values of the multiple independent variables, and that determines the second value of the dependent variable based only on the second values of the multiple independent variables.

6. A computer-readable medium, that is not a transitory, propagating signal, the computer-readable medium, having contents adapted to cause a computing system to:
receive a plurality of observations, each observation specifying values of each of a plurality of independent variables and a value of a dependent variable that occur together in a system to be modeled;
using the received observations, construct a first machine learning model that—based on (1) a first set of values of the independent variables for which an estimated value of the dependent variable is to be provided, (2) a second set of values of the independent variables for which an estimated value of the dependent variable is to be provided, and (3) a value of the dependent variable estimated by a second machine learning model for the first set of values of the independent variables—estimates a value of the dependent variable for the second set of values of the independent variables, wherein the first machine learning model comprises a collection of partitioning decision trees, wherein each partitioning decision tree can be traversed from its root to a leaf based upon a set of independent variable values and wherein each non-leaf node of the partitioning decision trees represents a partitioning of a range of possible values for an independent variable, wherein constructing the first machine learning model comprises:
randomly selecting a proper subset of available observations, and
dividing the randomly selected observations into two groups, each of whose dependent variable values are a smallest total distance from an aggregated dependent variable value, wherein choosing range partitions for nodes of at least one partitioning decision tree comprises choosing only range partitions that result in predicted values of a dependent value for a left child being less than a predicted value of the dependent value for a right child so that, among observations being used to construct the at least one partitioning decision tree, observations that traverse a right edge of the at least one partitioning tree from the distinguished node; and
store the first machine learning model.

7. The computer-readable medium of claim 6 wherein the first machine learning model is stored as a set of coefficient values.

8. The computer-readable medium of claim 6 wherein the first machine learning model determines a multiplier based on (1) the first set of values of the independent variables for which an estimated value of the dependent variable is to be provided and (2) the second set of values of the independent variables for which an estimated value of the dependent variable is to be provided, and multiplies a value of the dependent variable estimated by the second machine learning model by the multiplier in order to estimate a value of the dependent variable for the second set of values of the independent variables.

9. The computer-readable medium of claim 6 further having contents adapted to cause a computing system to:
receive a third set of values of each of the plurality of independent variables;
apply the second machine learning model to estimate a value of the dependent variable for the third set of values of the independent variables;
receive a fourth set of values of each of the plurality of independent variables; and
apply the stored first machine learning model to estimate a value of the dependent variable for the fourth set of values of the independent variables.

10. A computer-readable medium, that is not a transitory, propagating signal, the computer-readable medium having contents comprising a data structure, the data structure comprising information defining a machine learning delta model, the machine learning delta model configured to determine—based on (1) a first set of values of a plurality of independent variables, (2) a second set of values of the plurality of independent variables, and (3) a first value of a dependent variable predicted by a substantive model for the first set of values of the plurality of independent variables—a multiplier by which the first value of the dependent variable predicted by the substantive model for the first set of values of the plurality of independent variables should be multiplied to obtain a second value of the dependent variable for the second set of values of the plurality of independent variables, wherein the machine learning delta model comprises a collection of partitioning decision trees, wherein each partitioning decision tree can be traversed from its root to a leaf based upon a set of independent variable values and wherein each non-leaf node of the partitioning decision trees represents a partitioning of a range of possible values for an independent variable, the contents further comprising instructions for training the machine learning delta model, wherein constructing the machine learning delta model comprises:
randomly selecting a proper subset of available observations, and
dividing the randomly selected observations into two groups, each of whose dependent variable values are a smallest total distance from an aggregated dependent variable value, wherein choosing range partitions for nodes of at least one partitioning decision tree comprises choosing only range partitions that result in predicted values of a dependent value for a left child being less than a predicted value of the dependent value for a right child so that, among observations being used to construct the at least one partitioning decision tree, observations that traverse a left edge of the at least one partitioning tree from a distinguished node have a lower aggregate value than observations that traverse a right edge of the at least one partitioning tree from the distinguished node.

11. The computer-readable medium of claim 10 wherein the machine learning delta model comprises a sequence of expressions each based upon at least a portion of the independent variables, expressions of the sequence declining in complexity from a first end of the sequence to a second end of the sequence, the expressions of the sequence being configured for application from the sequence's first end toward its second end.

12. The computer-readable medium of claim 11 wherein the expressions of the sequence are configured for application from the sequence's first end toward its second end by assessing each applied expression of the sequence against a grid of possible values of one or more independent variables in whose direction the value of the dependent variable is to move, and selecting the first expression of the sequence whose assessment succeeds.

13. The computer-readable medium of claim 12 wherein the expressions of the sequence are further configured for application from the sequence's first end toward its second end by establishing a table that, for the selected expression, maps from percentage changes to the one or more independent variables in whose direction the value of the dependent variable is to move to an allowable range of delta adjustments.

14. A method in a computing system, the method comprising:
  receiving a plurality of observations, each observation specifying values of each of a plurality of independent variables and a value of a dependent variable that occur together in a system to be modeled, at least one of the plurality of independent variables being designated to be monotonically linked to a dependent variable;
  using the received observations, constructing a machine learning model configured to be applied to independent variable value sets to predict for each independent variable value set, a value of the dependent variable, such that, where the machine learning model predicts a first value of the dependent variable for a first independent variable value set and predicts a second value of the dependent variable for a second independent variable value set in which the value of a designated independent variable varies from the value of the same designated independent variable in the first independent variable value set in a first direction, the predicted second value of the dependent variable does not vary from the predicted first value of the dependent variable in a second direction that is opposite the first direction, wherein the machine learning model comprises a collection of partitioning decision trees, wherein each partitioning decision tree can be traversed from its root to a leaf based upon a set of independent variable values and wherein each non-leaf node of the partitioning decision trees represents a partitioning of a range of possible values for an independent variable, wherein constructing the machine learning model comprises:
  randomly selecting a proper subset of available observations, and
  dividing the randomly selected observations into two groups, each of whose dependent variable values are a smallest total distance from an aggregated dependent variable value, wherein choosing range partitions for nodes of at least one partitioning decision tree comprises choosing only range partitions that result in predicted values of a dependent value for a left child being less than a predicted value of the dependent value for a right child so that, among observations being used to construct the at least one partitioning decision tree, observations that traverse a left edge of the at least one partitioning tree from a distinguished node have a lower aggregate value than observations that traverse a right edge of the at least one partitioning tree from the distinguished node; and
  storing the machine learning model.

15. The method of claim 14, further comprising:
  applying the stored machine learning model to predict for the first independent variable value set a first value of the dependent variable;
  receiving a third independent variable value set in which the value of a designated independent variable varies from the value of the same designated independent variable in the first independent variable value set in a third direction; and
  applying the stored machine learning model to predict for the third independent variable value set a third value of the dependent variable, the third value of the dependent variable not varying from the first value of the dependent variable in a fourth direction that is opposite the third direction.

16. The method of claim 14 wherein the constructing constructs a model comprising at least one partitioning decision tree,
  each partitioning decision tree comprising leaf nodes and non-leaf nodes and being constructed based on at least a portion of the received plurality of observations,
  and wherein the constructing establishes each non-leaf node by defining a split among possible values of a particular independent variable that directs to a left child of the non-leaf node a first subset of the portion of observations and directs to a right child of the non-leaf node a second subset of the portion of observations not intersecting with the first subset of the portion of observations,
  and wherein, for each node defining a split among possible values of a designated independent variable, the constructing constrains the split such that the split does not direct to the left child of the node a first subset of observations that specify values of the dependent variable whose aggregate is larger than an aggregate of values of the dependent variable specified by a second subset of observations directed to the right child of the node.

17. A computer-readable medium, that is not a transitory, propagating signal, the computer-readable medium having contents comprising a data structure, the data structure comprising information defining a machine learning statistical model, the machine learning statistical model configured to predict a value of a dependent variable for each of a plurality of independent variable value sets, such that, where the model predicts a first value of the dependent variable for a first independent variable value set and predicts a second value of the dependent variable for a second independent variable value set in which the value of a designated independent variable varies from the value of the same designated independent variable in the first independent variable value set in a first direction, the predicted second value of the dependent variable does not vary from the predicted first value of the dependent variable in a second direction that is opposite the first direction, wherein the machine learning statistical model comprises a collection of partitioning decision trees, wherein each partitioning decision tree can be traversed from its root to a leaf based upon a set of independent variable values and wherein each non-leaf node of the partitioning decision trees represents a partitioning of a range of possible values for an independent variable, the contents further comprising instructions for training the machine learning statistical model, wherein constructing the machine learning statistical model comprises:
  randomly selecting a proper subset of available observations, and
  dividing the randomly selected observations into two groups, each of whose dependent variable values are a smallest total distance from an aggregated dependent variable value, wherein choosing range partitions for nodes of at least one partitioning decision tree comprises choosing only range partitions that result in predicted values of a dependent value for a left child being less than a predicted value of the dependent value for a right child so that, among observations being used to construct the at least one partitioning decision tree, observations that traverse a left edge or the at least one partitioning tree from a distinguished node have a lower aggregate value than observations that traverse a right edge of the at least one partitioning tree from the distinguished node.

18. The computer-readable medium of claim 17 wherein each partitioning decision tree comprises leaf nodes and non-leaf nodes, each of the nodes specifying a value of the dependent variable, and wherein each non-leaf node defines a split among possible values of a particular independent variable that directs to a left child of the non-leaf node a first subrange of possible values of the independent variable and directs to a right child of the non-leaf node a second subrange of the possible values of the independent variable that does not intersect with the first subrange, and wherein, for each node defining a split among possible values of a designated independent variable, the node's left child specifies a value of the dependent variable that is not larger than a value of the dependent variable specified by the node's right child.

19. The method of claim 14, further comprising:

estimating a merit score for each of a plurality of cloud platforms, wherein the merit score for a first cloud platform of the plurality of cloud platforms is based on a predicted cost of the first cloud platform, a predicted response time of the first cloud platform, a predicted level of reliability of the first cloud platform, a predicted level of security of the first cloud platform, and a predicted error rate of the first cloud platform.

20. The method of claim 1, further comprising:

receiving a third occurence specifying a third value for each of the multiple independent variables of the plurality of independent variables, the third value of the distinguished independent variable varying from the first value of the distinguished independent variable in the second direction and wherein the third value for a first independent variable of the multiple independent variables is equal to the first value for the first independent variable of the multiple independent variables and wherein the third value for a second independent variable of the multiple independent variables is not equal to the first value for the second independent variable of the multiple independent variables; and subjecting the third independent variable values specified by the received third occurrence to the second machine learning statistical model to obtain a third value of the dependent variable, the third value of the dependent variable guaranteed not to vary from the first value of the dependent variable in the first direction that is opposite the second direction.

* * * * *

UNITED STATES PATENT AND TRADEMARK OFFICE
CERTIFICATE OF CORRECTION

PATENT NO. : 10,789,549 B1  
APPLICATION NO. : 15/439388  
DATED : September 29, 2020  
INVENTOR(S) : Bruce et al.

Page 1 of 2

It is certified that error appears in the above-identified patent and that said Letters Patent is hereby corrected as shown below:

On the Title Page

On the page 3, in Column 2, under "Other Publications", Line 22, delete "www.the free library." and insert -- www.thefreelibrary. --, therefor.

On the page 3, in Column 2, under "Other Publications", Line 64, delete "w w w .csw online." and insert -- www.cswonline. --, therefor.

On the page 4, in Column 1, under "Other Publications", Line 22, delete "w w w .csw online." and insert -- www.cswonline. --, therefor.

On the page 5, in Column 1, under "Other Publications", Line 38, delete "Issue7," and insert -- Issue 7, --, therefor.

On the page 6, in Column 1, under "Other Publications", Line 23, delete "Microstraqtegy," and insert -- Microstrategy, --, therefor.

On the page 9, in Column 1, under "Other Publications", Lines 37-38, delete "/http :/ /www .redfin." and insert -- /http://www.redfin. --, therefor.

In the Specification

In Column 2, Line 27, delete "operates" and insert -- operates. --, therefor.

In Column 9, Line 17, delete "size" and insert -- size: --, therefor.

In the Claims

In Column 10, Line 37, in Claim 1, delete "variables;" and insert -- variables, the multiple independent variables including a distinguished independent variable; --, therefor.

Signed and Sealed this  
Fifth Day of January, 2021

Andrei Iancu  
*Director of the United States Patent and Trademark Office*

CERTIFICATE OF CORRECTION (continued)
U.S. Pat. No. 10,789,549 B1

In Column 11, Line 51, in Claim 6, before "right" insert -- left edge of the at least one partitioning tree from a distinguished node have a lower aggregate value than observations that traverse a --.

In Column 13, Line 23, in Claim 14, delete "predict" and insert -- predict, --, therefor.

In Column 15, Line 5, in Claim 17, delete "or" and insert -- of --, therefor.

In Column 16, Line 8, in Claim 20, delete "occurence" and insert -- occurrence --, therefor.